(12) United States Patent
Iori et al.

(10) Patent No.: US 8,475,672 B2
(45) Date of Patent: Jul. 2, 2013

(54) PLASMA PROCESSING DEVICE, PLASMA PROCESSING METHOD AND METHOD OF MANUFACTURING ELEMENT INCLUDING SUBSTRATE TO BE PROCESSED

(75) Inventors: Kazuyuki Iori, Kawasaki (JP); Yukito Nakagawa, Kokubunji (JP)

(73) Assignee: Canon Anelva Corporation, Kawasaki-shi (JP)

( * ) Notice: Subject to any disclaimer, the term of this patent is extended or adjusted under 35 U.S.C. 154(b) by 0 days.

(21) Appl. No.: 13/193,856

(22) Filed: Jul. 29, 2011

(65) Prior Publication Data

US 2011/0309050 A1 Dec. 22, 2011

Related U.S. Application Data

(63) Continuation of application No. PCT/JP2010/051134, filed on Jan. 28, 2010.

(30) Foreign Application Priority Data

Feb. 6, 2009 (JP) .................................. 2009-025852

(51) Int. Cl.
*C23C 16/00* (2006.01)
*C23C 14/35* (2006.01)
*C23F 1/00* (2006.01)

(52) U.S. Cl.
USPC ............. 216/66; 216/67; 216/70; 204/298.37

(58) Field of Classification Search
USPC ...... 204/192.12, 298.16, 298.37; 156/345.42, 156/345.46, 345.49, 345.39, 345.4; 216/67, 216/70; 118/723 E, 723 MR, 723 MA
See application file for complete search history.

(56) References Cited

U.S. PATENT DOCUMENTS 5,346,579 A * 9/1994 Cook et al. ............... 156/345.42
6,076,483 A * 6/2000 Shintani et al. ........ 118/723 MA
2011/0121927 A1 5/2011 Iori et al.

\* cited by examiner

*Primary Examiner* — Rodney McDonald
(74) *Attorney, Agent, or Firm* — Fitzpatrick, Cella, Harper & Scinto

(57) ABSTRACT

The present invention provides a plasma processing device and a plasma processing method that can easily adjust plasma density distribution while making the plasma density uniform, and a method of manufacturing an element including a substrate to be processed. In an embodiment of the present invention, the inside of a vacuum vessel (1) is divided by a grid (4) having communication holes into a plasma generation chamber (2) and a plasma processing chamber (5). On the upper wall (26) of the plasma generation chamber (2), magnetic coils (12) are arranged such that magnetic field lines within the vacuum vessel (1) point from the center of the vacuum vessel (1) to a side wall (27), and, outside the side wall (27) of the plasma generation chamber (2), ring-shaped permanent magnets (13) are arranged such that a polarity pointing to the inside of the vacuum vessel (1) is a north pole and a polarity pointing to the outside of the vacuum vessel (1) is a south pole.

16 Claims, 16 Drawing Sheets

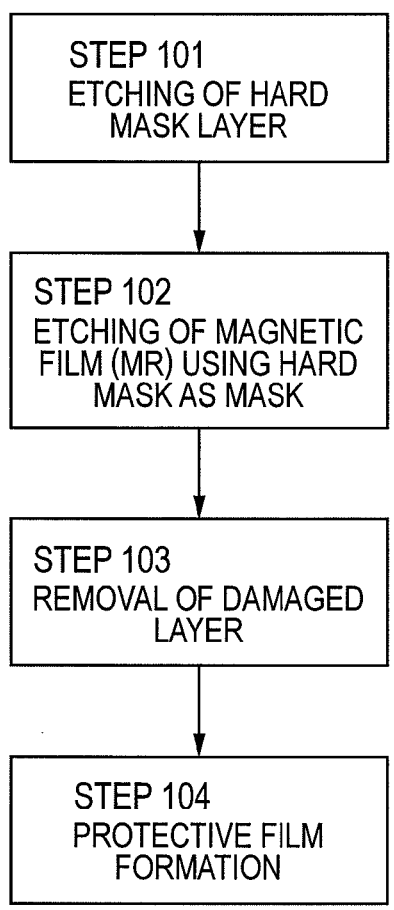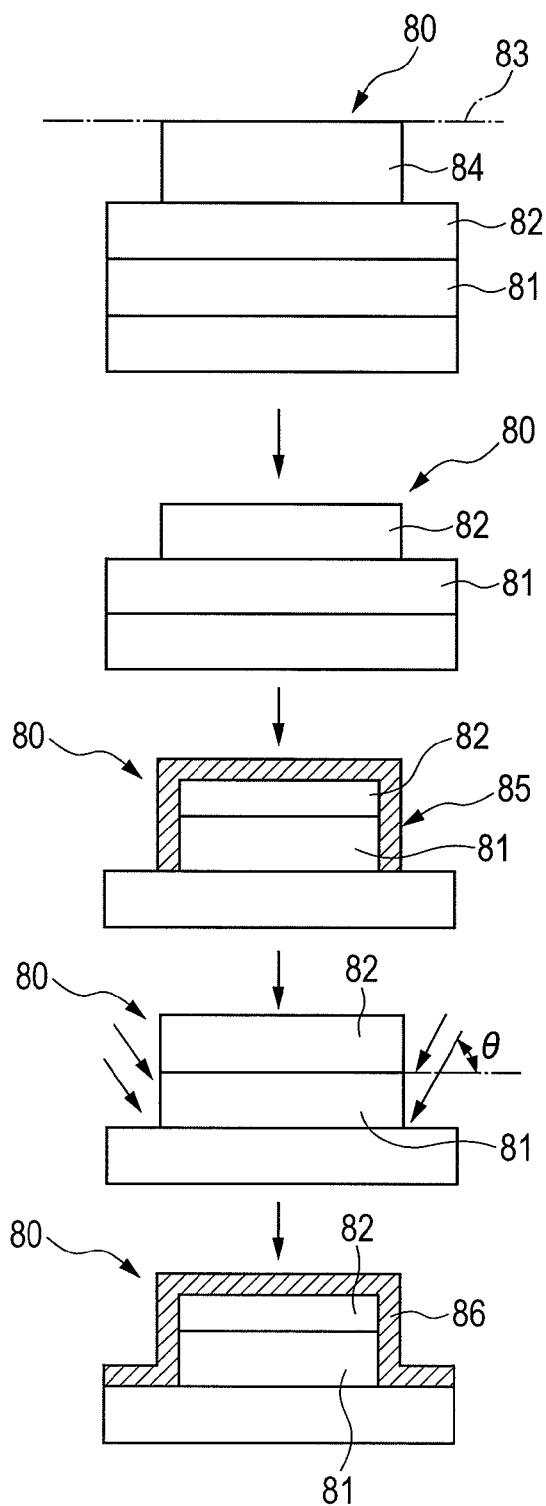

PLASMA PROCESSING DEVICE, PLASMA PROCESSING METHOD AND METHOD OF MANUFACTURING ELEMENT INCLUDING SUBSTRATE TO BE PROCESSED

CROSS-REFERENCES TO RELATED APPLICATIONS

This application is a continuation application of International Application No. PCT/JP2010/051134, filed Jan. 28, 2010, which claims the benefit of Japanese Patent Application No. 2009-025852, filed Feb. 6, 2009. The contents of the aforementioned applications are incorporated herein by reference in their entities.

TECHNICAL FIELD

The present invention relates to a plasma processing device, a plasma processing method and a method of manufacturing an element including a substrate to be processed. More particularly, the present invention relates to a plasma processing device and a plasma processing method that process a substrate with a plasma such as by utilizing the plasma to form a thin film on the surface of the substrate to be processed or etching the surface of the substrate to be processed, and a method of manufacturing an element including a substrate to be processed.

BACKGROUND ART

Conventionally, for example, in etching devices, a magnetron type plasma generation device using a magnet, an ECR discharge type plasma generation device using electron cyclotron resonance and a helicon type plasma generation device using a helicon wave have been mainly used.

As a plasma generation device, patent document 1 discloses a device in which a plurality of permanent magnets magnetized along a ring-shaped center axis is concentrically arranged on the upper wall of a plasma generation chamber so as to have alternate polarities, and in which a magnetic coil is further arranged outside the side wall of the plasma generation chamber. In the device, a coil magnetic field is generated such that magnetic field lines are pointed to the side of a substrate by the magnetic coil arranged on the side wall, and thus a plasma generated in the vicinity of the upper wall of the plasma generation chamber is widely diffused by the coil magnetic field.

Moreover, patent document 2 discloses a device in which a substrate holder connected to a self-bias generation high frequency power supply is arranged sufficiently away from a plasma generation high frequency electrode, and in which magnetic coils are arranged both outside a vacuum vessel between the high frequency electrode and the substrate holder and on the back surface of the high frequency electrode, respectively. The device freely controls the self bias and performs stable plasma processing without damaging an item to be processed.

Another method of realizing the uniformity of plasma is to concentrically and triply arrange cylindrical permanent magnets that are magnetized in the direction of the center axis of the cylinder (in the longitudinal direction of the cylinder) so as to have alternate polarities. In this case, a boundary surface (separatrix) formed between magnetic field lines formed by two cylindrical permanent magnets (permanent magnets in the center and the outermost side) arranged outside and magnetic field lines formed by two cylindrical permanent magnets (permanent magnets in the center and the innermost side) arranged inside is produced within a vacuum vessel. Since the plasma expands in the inside surrounded by the separatrix, strength of the permanent magnet is optimized and thus it is possible to control the diffusion region of the plasma and adjust the uniformity. This type of magnetic field generation device is proposed, and is applied to a planar type ECR device and the like (see patent document 3).

RELATED ART DOCUMENTS

Patent Documents

[Patent document 1] Japanese Unexamined Patent Application Publication No. H10-270428
[Patent document 2] Japanese Patent No. 2652547
[Patent document 3] Japanese Unexamined Patent Application Publication No. H6-325899

SUMMARY OF INVENTION

As a substrate to be processed that is used for manufacturing a semiconductor device, a substrate having a diameter of about 30 cm has been mainly used in recent years, and it is necessary to uniformly perform processing on the entire surface of the substrate.

However, in the device disclosed in patent document 1, in order to make the generated plasma diffuse and become uniform, it is necessary for charged particles generated by the plasma to fly a longer distance within the coil magnetic field as the substrate to be processed becomes larger, and thus it is disadvantageously difficult to reduce the size of the device.

Furthermore, another embodiment of patent document 1 discloses, as shown in FIGS. 5A and 5B, a plasma processing device configured to form uniform plasma by a permanent magnet 52 arranged on the upper wall of a plasma generation device 51 and permanent magnets 53a to 53h arranged on the side wall of the plasma generation device 51. As shown in FIG. 5B, the permanent magnets 53a to 53h are arranged apart from each other on the side wall of the plasma generation device 51 along the outer circumference of the side wall so as to have alternate polarities. Hence, as shown in FIG. 5B, a plasma P1 generated within the plasma generation device 51 is returned by respective magnetic fields B1 generated by the permanent magnets 53a to 53h in directions A indicated by arrows.

However, in the configuration shown in FIGS. 5A and 5B, the plasma becomes disadvantageously nonuniform between the portion of the side wall of the plasma generation device 51 where the permanent magnets 53a to 53h are arranged and the portion where they are not arranged. Furthermore, in order to adjust the plasma density distribution, it is disadvantageously necessary to replace the permanent magnet 52 and the permanent magnets 53a to 53h each time. FIG. 5B is a cross-sectional view taken along line VB-VB of FIG. 5A.

In the device configuration using only the magnetic coil, disclosed in patent document 2, stable discharge can be obtained but it is impossible to prevent the behavior of the charged particles escaping to the wall of the vacuum vessel, and thus it is disadvantageously difficult to uniformly generate a high-density plasma.

In particular, in the plasma etching device disclosed in patent document 2, as shown in FIG. 6, a region where the plasma density distribution can be adjusted by a coil 61 is limited to a region on the upper side of the coil 61. Hence, it is disadvantageously difficult to adjust the plasma density distribution between the lower side of the coil 61 and a substrate 62. In FIG. 6, reference numeral 63 represents a plasma generation high-frequency electrode, and reference numeral 64 represents a magnetic coil arranged on the back surface of the high-frequency electrode 63.

In the device disclosed in patent document 3, three cylindrical permanent magnets which are magnetized such that adjacent polarities in the axial direction of the cylinders are opposite to each other are concentrically arranged. In the distribution of magnetic field lines formed by this magnetic circuit, a boundary surface (separatrix) is formed between magnetic field lines formed by two cylindrical permanent magnets located outside and magnetic field lines formed by two cylindrical permanent magnets located inside. It has been proved that the position of the separatrix corresponds to the position of a local minimal value of a plasma floating potential and that the uniformity of the plasma density is satisfactory in the inside surrounded by the floating potential local minimal portion. Thus, in order to increase the size of the portion having the satisfactory uniformity of the plasma density, it is effective to configure the magnetic circuit such that the separatrix expands outward toward the side of the substrate from the arrangement position of the three magnets described above.

However, in the device that utilizes the permanent magnets for generating the separatrix as disclosed in patent document 3, it is necessary for the adjustment of separatrix shape to replace the permanent magnets, and thus it is disadvantageously difficult to perform the adjustment to achieve uniform plasma distribution.

An object of the present invention is to provide a plasma processing device that can solve at least one of the problems described above. Specifically, the object of the present invention is to provide a plasma processing device and a plasma processing method that can easily adjust plasma density distribution while making the plasma density uniform, and a method of manufacturing an element including a substrate to be processed.

Another object of the present invention is to provide a plasma processing device and a plasma processing method that can easily adjust the shape of a separatrix and that can easily make uniform the plasma distribution of a large area, and a method of manufacturing an element including a substrate to be processed.

To achieve the above objects, according to the present invention, there is provided a plasma processing device including: a vacuum vessel; a plasma generation mechanism for generating a plasma within the vacuum vessel; a substrate holder that is arranged within the vacuum vessel and for holding a substrate to be processed; and a magnetic circuit for generating a magnetic field within the vacuum vessel, wherein the magnetic circuit includes: a first magnetic field generation means that is provided on an upper wall of the vacuum vessel opposite the substrate holder, that can adjust the generated magnetic field by an applied current, and that is arranged such that one magnetic pole of a north pole and a south pole points to an inside of the vacuum vessel and the other magnetic pole points to an outside of the vacuum vessel; and a second magnetic field generation means that is provided on a side wall of the vacuum vessel and that is arranged such that the one magnetic pole points to the inside of the vacuum vessel and the other magnetic pole points to the outside of the vacuum vessel.

According to the present invention, there is provided a plasma processing method including: a step of arranging a substrate to be processed on a substrate holder provided within a vacuum vessel; a step of generating a plasma within the vacuum vessel; and a step of forming a separatrix expanding from an upper wall to the substrate holder by a magnetic field line generated by applying a current to a first magnetic field generation means that is provided on the upper wall of the vacuum vessel opposite the substrate holder and that can adjust a generated magnetic field by an applied current and a magnetic field line generated by a second magnetic field generation means provided on a side wall of the vacuum vessel, wherein, in the step of forming the separatrix, the shape of the separatrix can be adjusted by adjusting the current applied to the first magnetic field generation means.

According to the present invention, there is provided a method of manufacturing an element including a substrate to be processed, the method including: a step of arranging the substrate to be processed on a substrate holder provided within a vacuum vessel for performing predetermined plasma processing; a step of generating a plasma within the vacuum vessel; and a step of forming a separatrix expanding from an upper wall to the substrate holder by a magnetic field line generated by applying a current to a first magnetic field generation means that is provided on the upper wall of the vacuum vessel opposite the substrate holder and that can adjust a generated magnetic field by an applied current and a magnetic field line generated by a second magnetic field generation means provided on a side wall of the vacuum vessel, and of performing the predetermined plasma processing, wherein, the step of performing the plasma processing can adjust the shape of the separatrix by adjusting the current applied to the first magnetic field generation means.

According to the present invention, the configuration of the magnetic circuit that applies a magnetic field to the plasma generation chamber is well devised, and thus it is possible to freely control a satisfactory range of uniformity of a plasma. In order to generate a desired magnetic field, it is possible to perform minute adjustment on the shape of a separatrix by changing a current flowing through the magnetic coil which is a component of the magnetic field. Thus, for example, it is possible to form a magnetic field with the separatrix expanded and to uniformly diffuse the plasma generated within the plasma generation chamber in a short distance. If the separatrix is narrowed near the area where the plasma is generated, high-density plasma can be utilized for processing the substrate, and thus it is possible to perform surface processing at a high processing speed.

BRIEF DESCRIPTION OF THE DRAWINGS

FIG. 8A is a flowchart showing a procedure of manufacturing a magnetoresistance effect element according to an embodiment of the present invention;

FIG. 8B is a diagram illustrating the cross-sectional structure of a pre-processing element corresponding to the flowchart of FIG. 8A;

DESCRIPTION OF EMBODIMENTS

Figure 1:
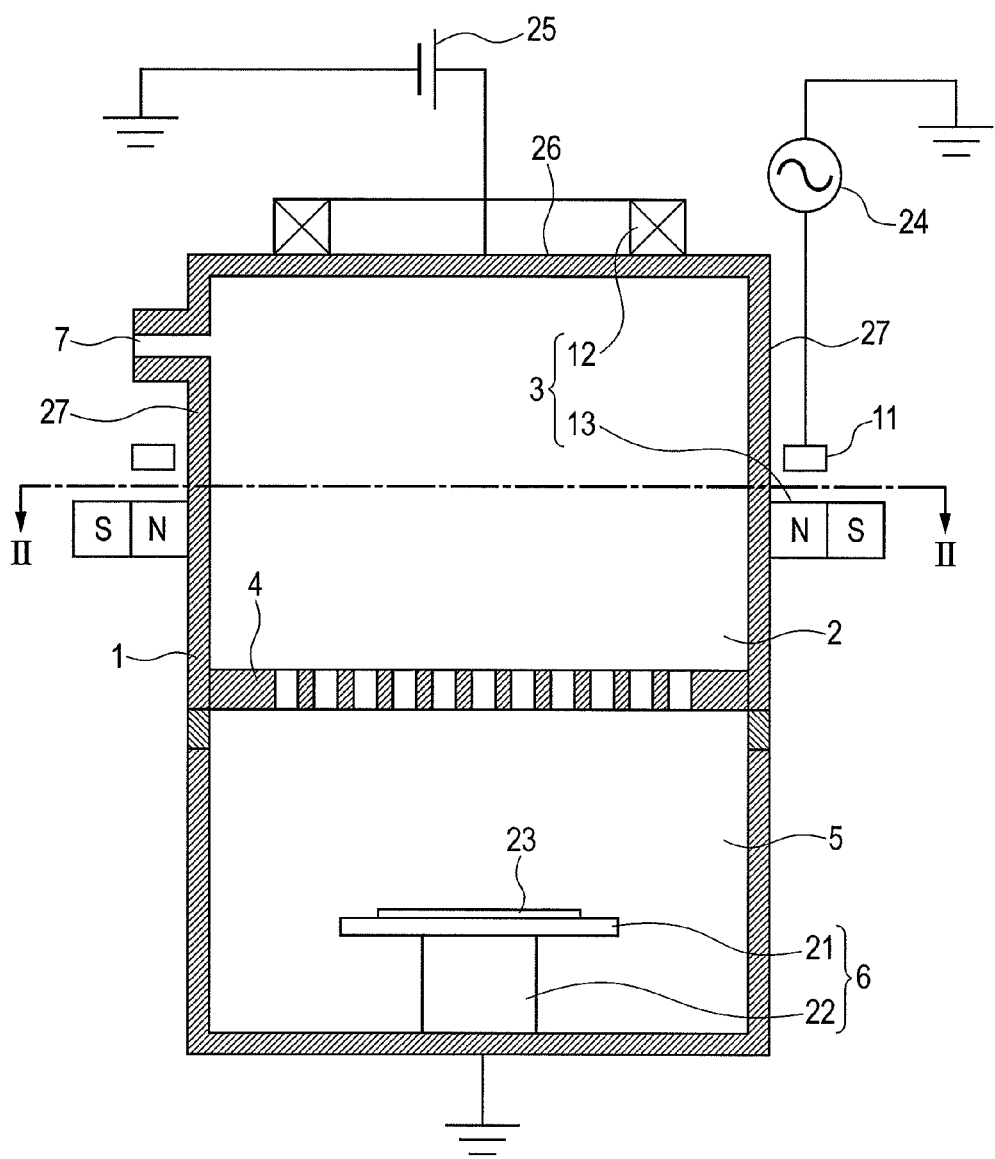
FIG. 1 is a schematic cross-sectional view showing the configuration of an embodiment of a plasma processing device according to the present invention.

Some preferred embodiments of the present invention will be described below with reference to accompanying drawings. In the drawings described below, parts having the same function are identified with the same reference numerals, and their description will not repeated.

First Embodiment

Figure 2:
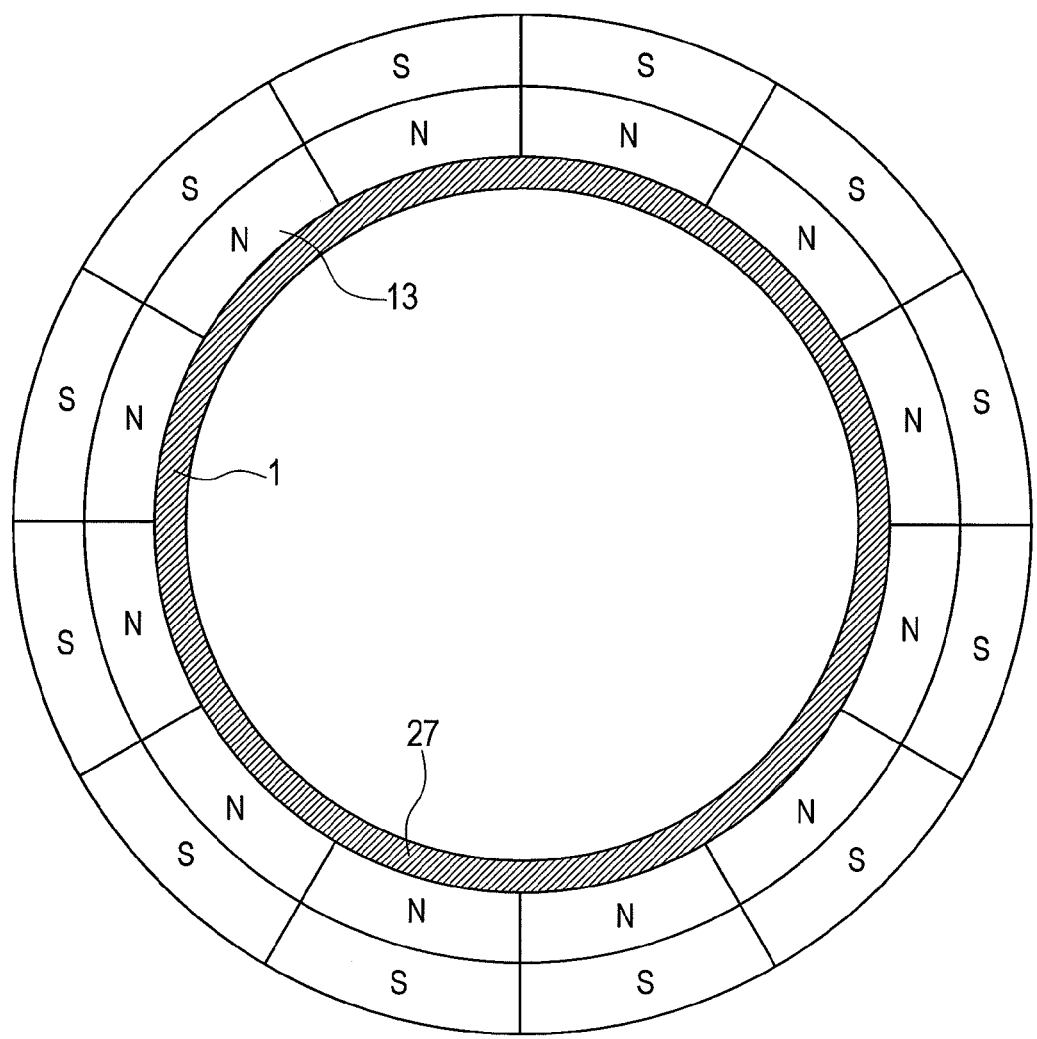
FIG. 2 is a cross-sectional view taken along line II-II of FIG. 1.
Figure 3:
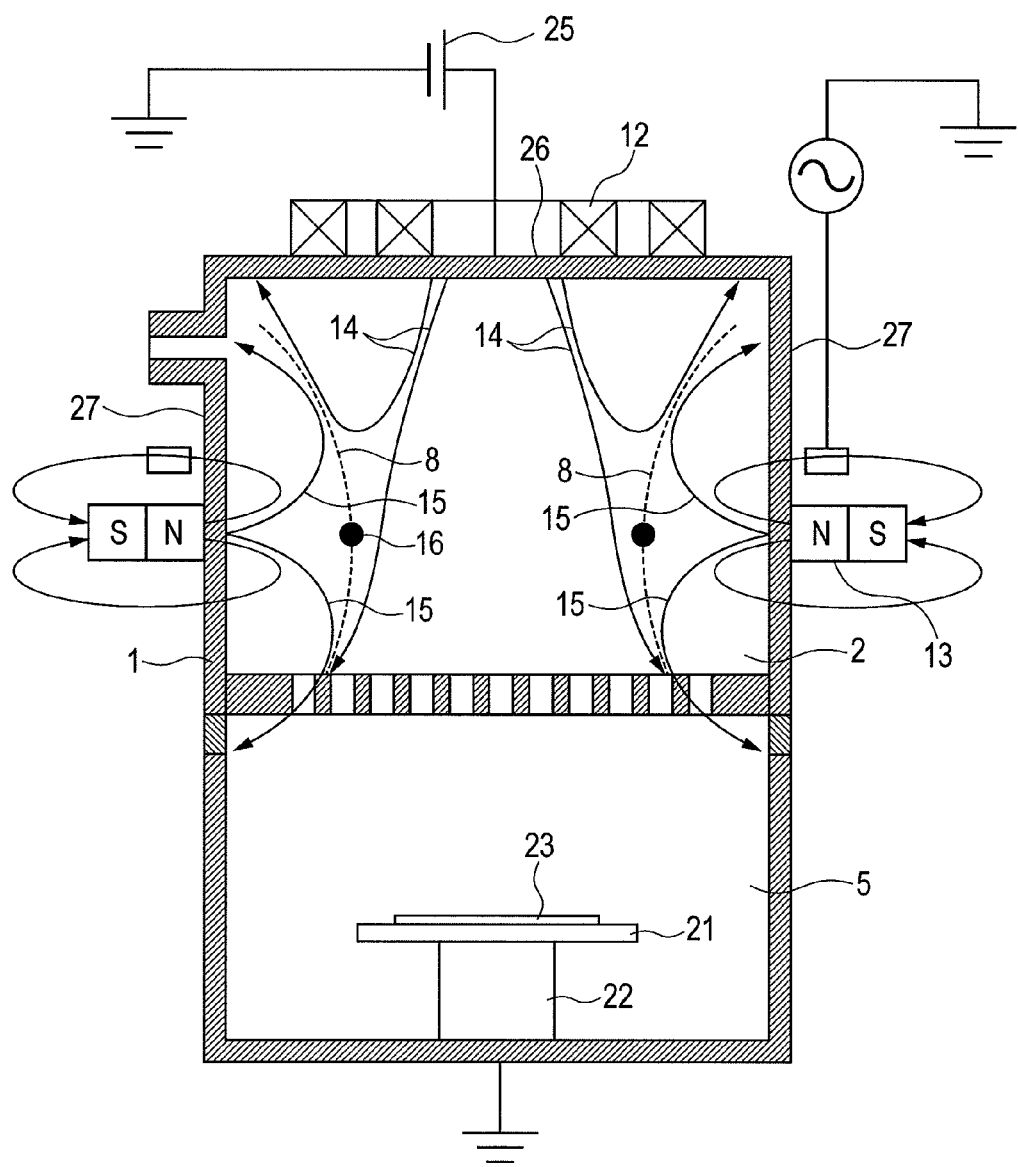
FIG. 3 is a diagram showing the distribution of magnetic field lines generated in the device of FIG. 1.

FIG. 1 is a cross-sectional view schematically showing the configuration of an inductively-coupled plasma processing device that is a preferred embodiment of a plasma generation device according to the present invention; FIG. 2 is a cross-sectional view taken along line II-II of FIG. 1; and FIG. 3 is a diagram showing the distribution of magnetic field lines generated in the device of the present embodiment.

In the plasma processing device of FIG. 1, a vacuum vessel 1 is divided by a bulkhead plate (grid) 4, which has communication holes, into a plasma generation chamber 2 and a plasma processing chamber 5. The plasma generation chamber 2 includes a plasma generation mechanism such as an SLA (single loop antenna) 11 and a magnetic circuit 3 having magnetic coils 12 and permanent magnets 13, and the magnetic circuit 3 generates a magnetic field within the vacuum vessel 1. The plasma processing chamber 5 includes a substrate holding mechanism 6. The vacuum vessel 1 includes: a gas supply mechanism (not shown) connected to a gas supply port 7 for introducing a gas used for the generation of a plasma; and a gas discharge mechanism (not shown) for bringing the inside of the vacuum vessel 1 into a required reduced-pressure state. The gas supply mechanism and the gas discharge mechanism are generally well-known, and hence their detailed illustration is omitted.

As the plasma generation mechanism, it is not always necessary to use the SLA; as long as a plasma can be generated, a flat plate electrode or an antenna of another shape may be used instead. When the flat plate electrode is used, it is preferably arranged within the vacuum vessel 1 so as to face a substrate to be processed 23, which will be described later.

In the present embodiment, the magnetic circuit 3 includes the magnetic coils 12 and the permanent magnets 13. The magnetic coils 12 are arranged outside the upper wall of the vacuum vessel 1, that is, outside the upper wall 26 of the plasma generation chamber 2; its center axis is arranged to coincide with the center axis of the plasma generation chamber 2. One magnetic coil 12 is provided or a plurality of the magnetic coils 12 is provided concentrically, and is fixed to the side of the atmosphere of the plasma generation chamber 2 (the outside of the plasma generation chamber 2). A DC power supply 25 is connected to the magnetic coils 12; a current for generation of a magnetic field is supplied from the DC power supply 25, and thus the magnetic coils 12 generate the magnetic field. The DC power supply 25 is configured to be capable of adjusting the value of an output current; the current value can be controlled by an unillustrated control device. The current through the magnetic coils 12 is applied such that magnetic field lines within the vacuum vessel 1 point from the center of the vacuum vessel 1 to the side wall 27 of the vacuum vessel 1. Specifically, the magnetic coils 12 provided on the upper wall 26 of the plasma generation chamber 2 (the vacuum vessel 1) opposite a substrate holder 21, which will be described later, are configured to generate magnetic field lines that point from the upper wall 26 toward the side wall 27 (the magnetic coils 12 are arranged such that the north pole thereof points to the side of the vacuum vessel 1 and the south pole points to the side of the atmosphere (the opposite side of the vacuum vessel 1)).

The permanent magnets 13 are fixed to the side wall 27 of the vacuum vessel 1. Specifically, as shown in FIG. 2, outside the side wall 27 of the plasma generation chamber 2, the permanent magnets 13 that are magnetized in the direction of the center axis of the plasma generation chamber 2 are arranged concentrically with respect to the center axis of the plasma generation chamber 2 so as to have a ring shape. If the ring-shaped permanent magnets 13 cannot be magnetized in the direction of the center of the ring, the ring of the permanent magnets may be produced by arranging thin magnet strips that can obtain a necessary magnetic field with the magnetization direction directed to the center axis of the plasma generation chamber 2 (the vacuum vessel 1) (for example, with the north poles directed to the center axis) so as to have a ring shape.

An applied current to all the magnetic coils 12 is set such that the magnetic field lines within the plasma generation chamber 2 point from the center of the vacuum vessel 1 to the side wall.

The permanent magnets 13 are arranged to be magnetized such that the polarity toward the inside of the vacuum vessel 1 in the direction of the center axis of the ring is the north pole and the polarity toward the outside of the vacuum vessel 1 is the south pole. As long as the permanent magnets 13 in which the polarity in the direction of the center axis of the vacuum vessel 1 is the north pole are ring-shaped and are arranged on the side wall 27 of the vacuum vessel 1, the number of rings can freely be determined.

The diameter and the cross-sectional shape of the magnetic coils 12 are not particularly limited. As long as the magnetic coils 12 are arranged on the upper wall 26 of the plasma generation chamber 2, the number of the magnetic coils 12 is not limited. In FIG. 3, in order to form the separatrices 8 to have the largest possible diameter, the magnetic field lines are generated in a wide region of the upper wall 26, and the magnetic coils 12 each are doubly arranged around the end of the upper wall 26 and around the center of the upper wall 26 such that the end of the separatrices 8 reach not only the upper wall 26 but also the side wall 27.

The current applied to the permanent magnets 13 and the magnetic coils 12 is experimentally determined in consideration of applicable process conditions each time.

In order to perform processing on the substrate in the plasma processing device of FIG. 1, air within the vacuum vessel 1 is first discharged so as to have a predetermined pressure with an unillustrated discharge mechanism (vacuum pump or the like), and then gas is introduced so as to have a predetermined pressure with an unillustrated gas supply mechanism.

The substrate holding mechanism 6 includes the substrate holder 21 for placing the substrate to be processed 23; for example, the substrate holder 21 is arranged by a fixed shaft 22 within the vacuum vessel 1. The substrate holder 21 and the fixed shaft 22 are grounded; in order to apply to the substrate 23 a bias voltage such as high-frequency waves, it is also possible to set the substrate holding mechanism 6 at a floating potential by inserting an insulator or the like between the vacuum vessel 1 and the fixed shaft 22. It is also possible to provide a mechanism for cooling or heating the substrate 23 within the substrate holder 21 and the fixed shaft 22.

The substrate to be processed 23 is arranged on the substrate holder 21. The surface of the substrate 23 to be processed faces the antenna of the plasma generation chamber 2 or the electrode. When, as in the present embodiment, the SLA 11 is arranged outside the side wall 27 of the plasma generation chamber 2, the surface of the substrate 23 to be processed is arranged to face the plasma generation chamber 2. When a flat plate-shaped electrode is used, the electrode is arranged below the upper wall of the plasma generation chamber 2, and the electrode is arranged opposite the surface of the substrate 23 to be processed through the grid 4. Then, RF power is applied from a RF power supply 24 to the antenna 11 or the RF power and DC power are applied to the electrode, and thus a plasma is produced within the plasma generation chamber 2. A bias voltage is applied to the substrate 23 or a bias voltage is applied to the entire plasma generation chamber 2, to increase a plasma level higher than the ground, and thus it is possible to perform, on the surface of the substrate 23, predetermined processing such as ion etching. The illustration of a mechanism for carrying in or out the substrate 23 is omitted.

The configuration shown in FIG. 1 is conceptual; any structure equivalent in function to the structures of a specific plasma generation mechanism and a specific magnetic circuit can be employed.

FIG. 3 shows an example of magnetic field lines 14 and 15 generated by the magnetic circuit 3 shown in FIG. 1. The magnetic field lines are diffused vertically from an area where the magnetic field line 14 generated by the magnetic coils 12 collides with the magnetic field line 15 generated by the permanent magnets 13, and are then spread toward the side wall 27. The separatrices 8 are also generated along the magnetic field lines and diffused toward the side wall 27. The distribution of the separatrices 8 can be controlled by the current through the magnetic coils 12; the current applied to the magnetic coils 12 is increased, and thereby it is possible to further displace the collision areas 16 of the magnetic field lines 14 and 15 and the position of the separatrices 8 toward the side wall 27 of the plasma generation chamber 2. By contrast, the current applied to the magnetic coils 12 is decreased, and thereby it is possible to displace the collision areas 16 of the magnetic field lines and the position of the separatrices 8 toward the center axis of the magnetic coils 12.

In other words, by adjusting the current to the magnetic coils 12, it is possible to control a satisfactorily uniform range while preventing or reducing the diffusion of the plasma. For example, the control device controls the DC power supply 25, and thereby it is possible to control the current to the magnetic coils 12. Alternatively, an operator may directly set an output value of the DC power supply 25.

Figure 4A:
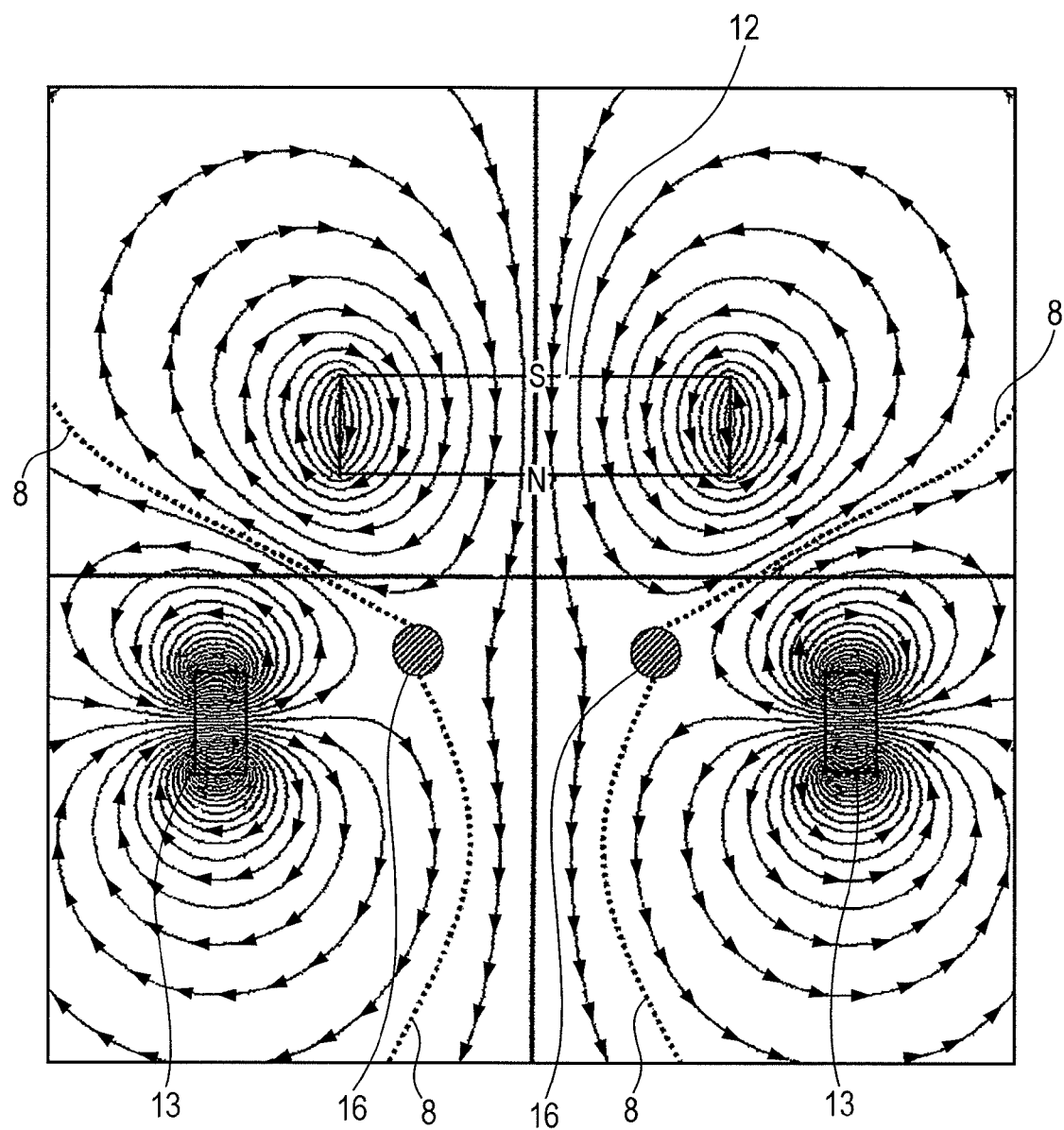
FIG. 4A is a diagram showing the calculation result of the distribution of magnetic field lines generated in the device of FIG. 1.
Figure 4B:
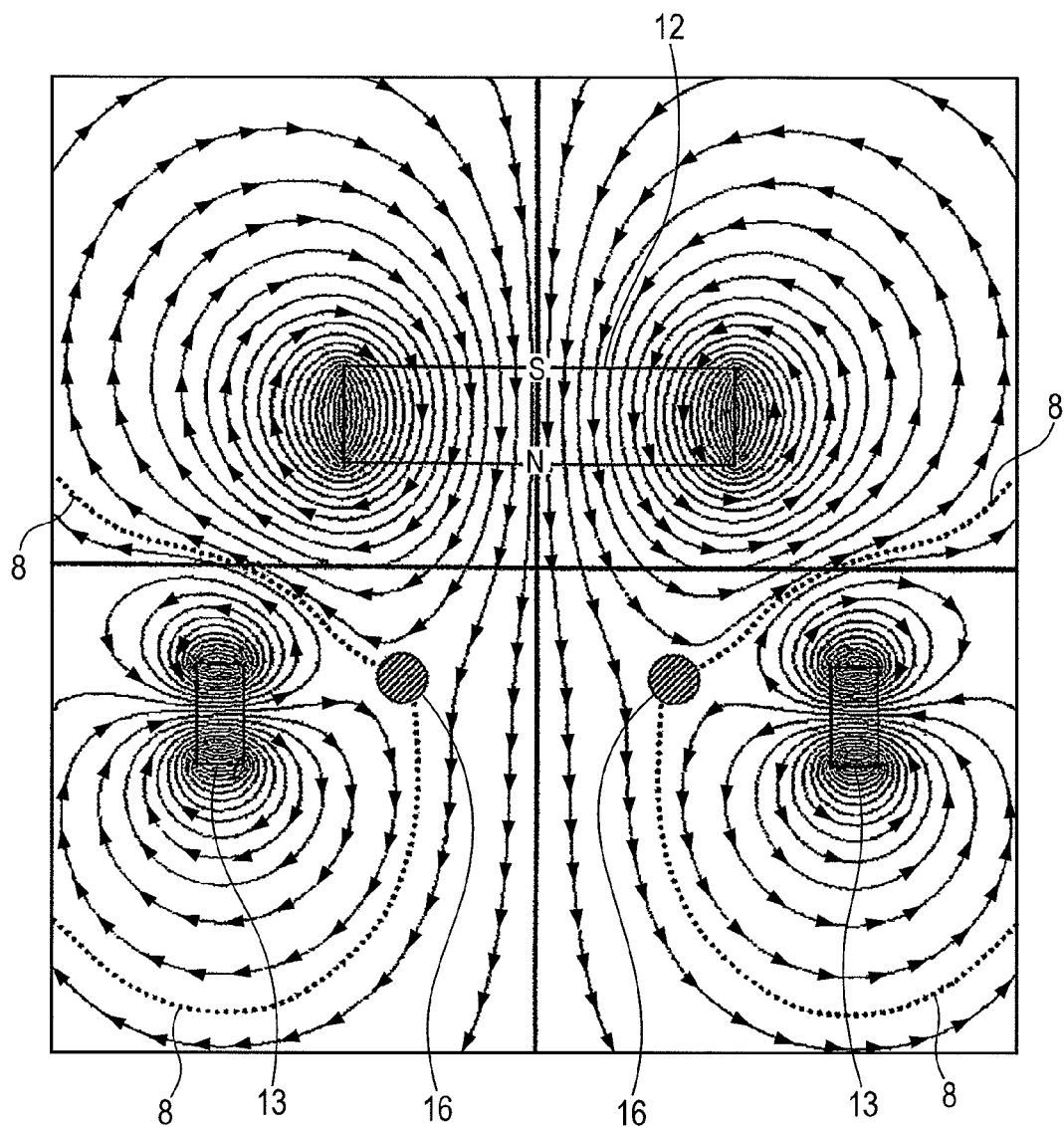
FIG. 4B is a diagram showing the calculation result of the distribution of magnetic field lines generated when the magnitude of a coil current is increased in FIG. 4A.
Figure 4C:
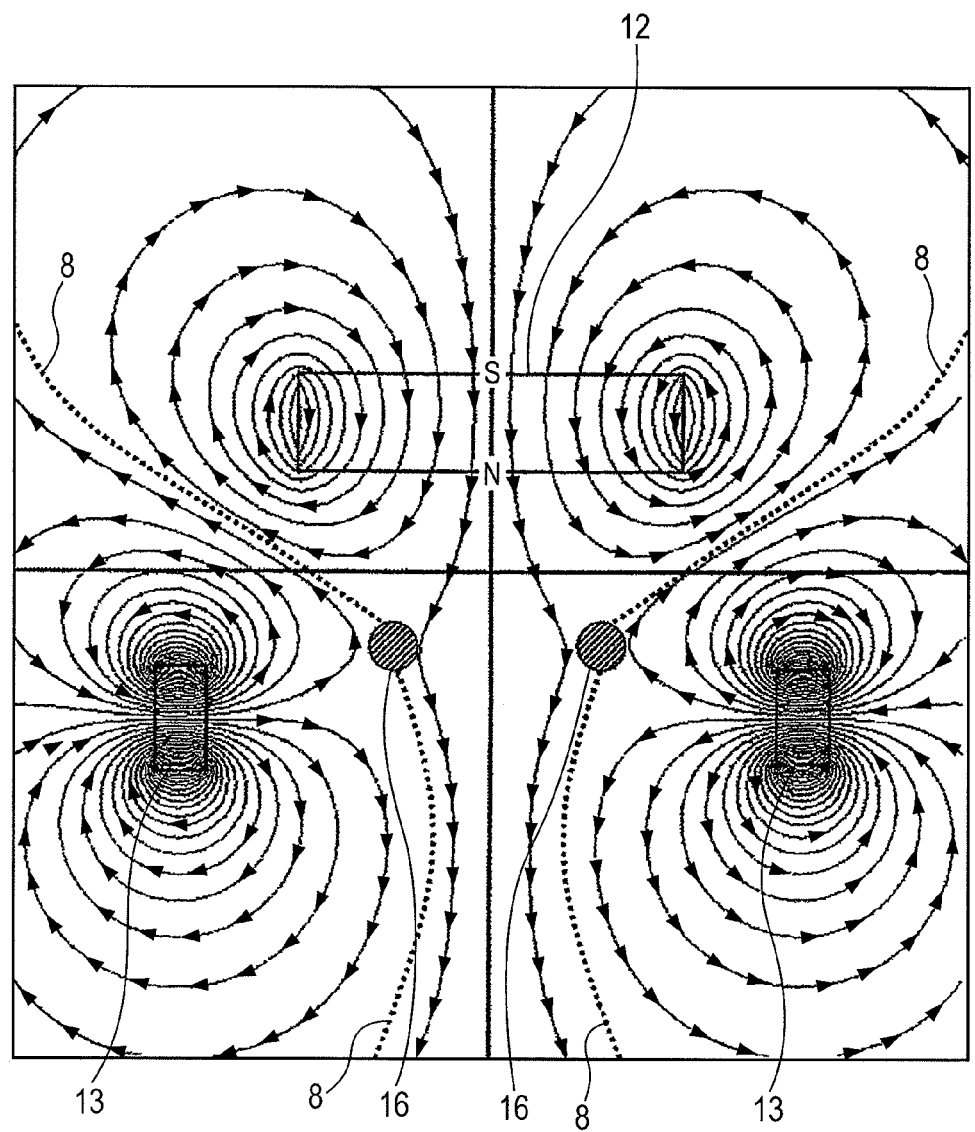
FIG. 4C is a diagram showing the calculation result of the distribution of magnetic field lines generated when the magnitude of the coil current is decreased in FIG. 4A.

For example, FIG. 4A shows an example of the result of calculation of the distribution of magnetic field lines generated in the same magnetic circuit as in FIG. 1; FIG. 4B shows the distribution of magnetic field lines when the current applied to the magnetic coils 12 is increased; and FIG. 4C shows the distribution of magnetic field lines when the current applied to the magnetic coils 12 is decreased. Consequently, it is possible to see how the collision areas 16 of the magnetic field lines shown in FIG. 4A are moved by controlling the current applied to the magnetic coils 12. It is also possible to see how the separatrices 8 are moved by controlling the current applied to the magnetic coils 12.

Figure 4D:
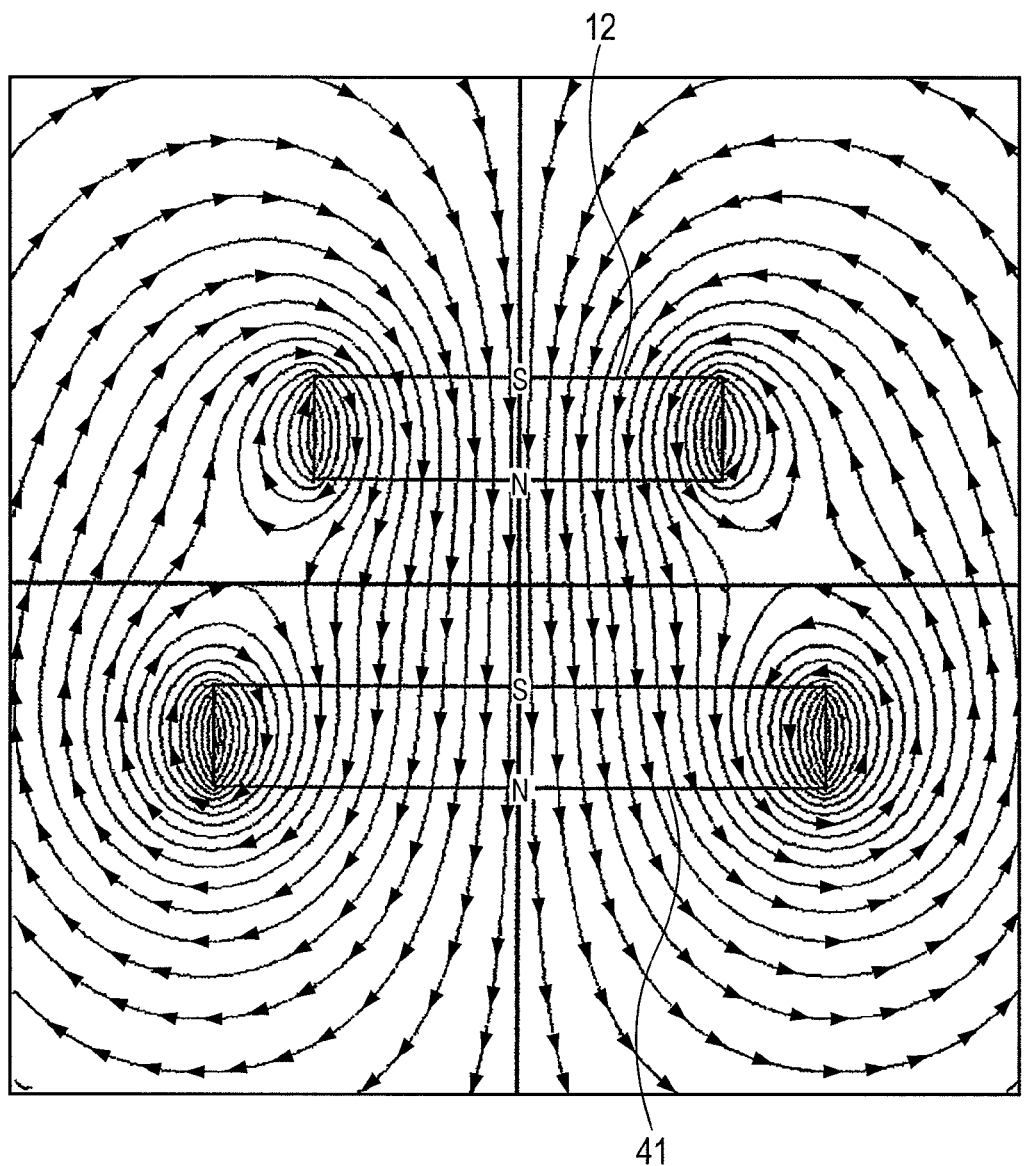
FIG. 4D is a diagram showing the calculation result of the distribution of magnetic field lines generated in a conventional plasma processing device.
Figure 4E:
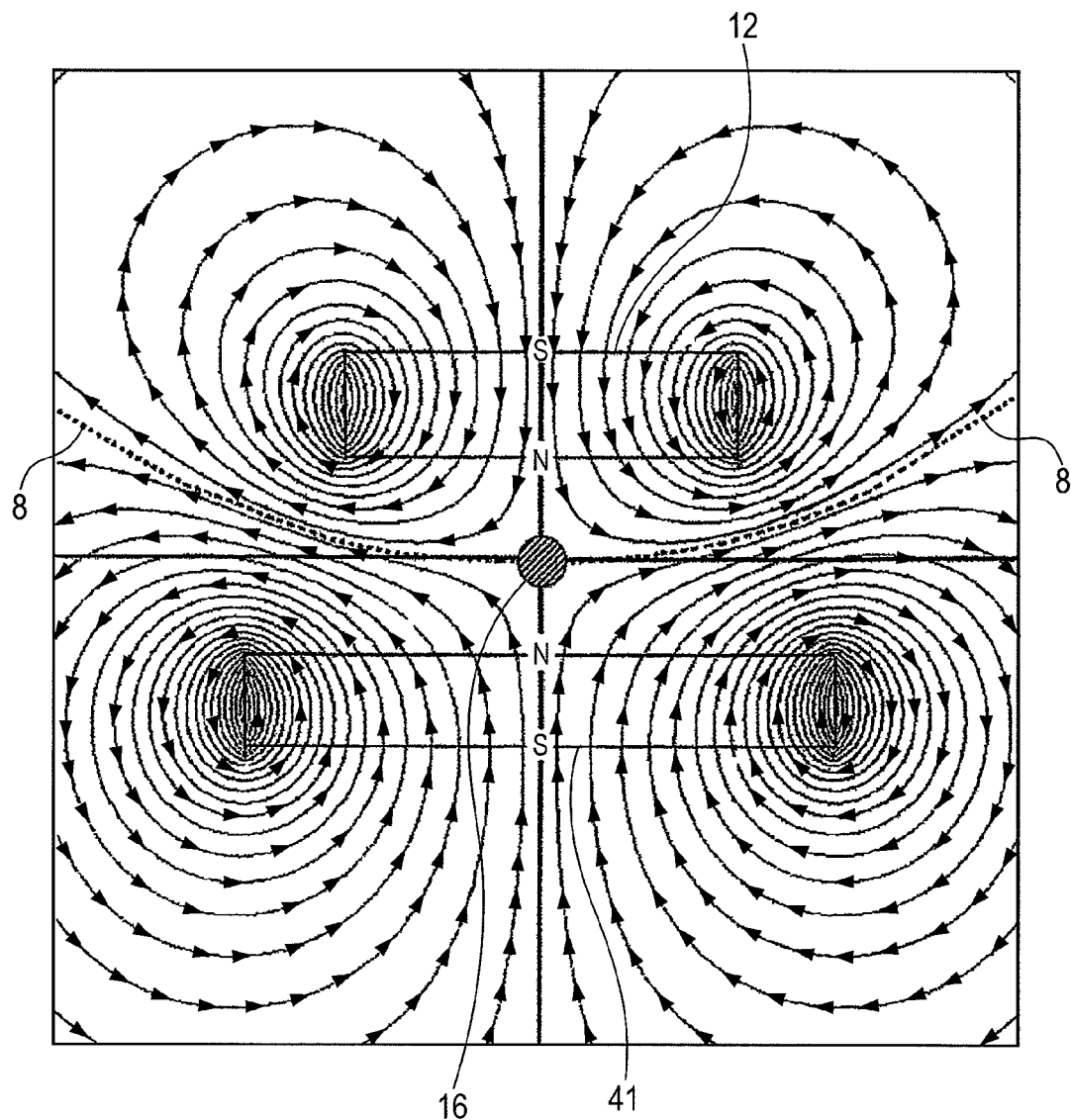
FIG. 4E is a diagram showing the calculation result of the distribution of magnetic field lines generated when the direction of the coil current of the side wall of a vacuum vessel is reversed in FIG. 4D.
Figure 5A:
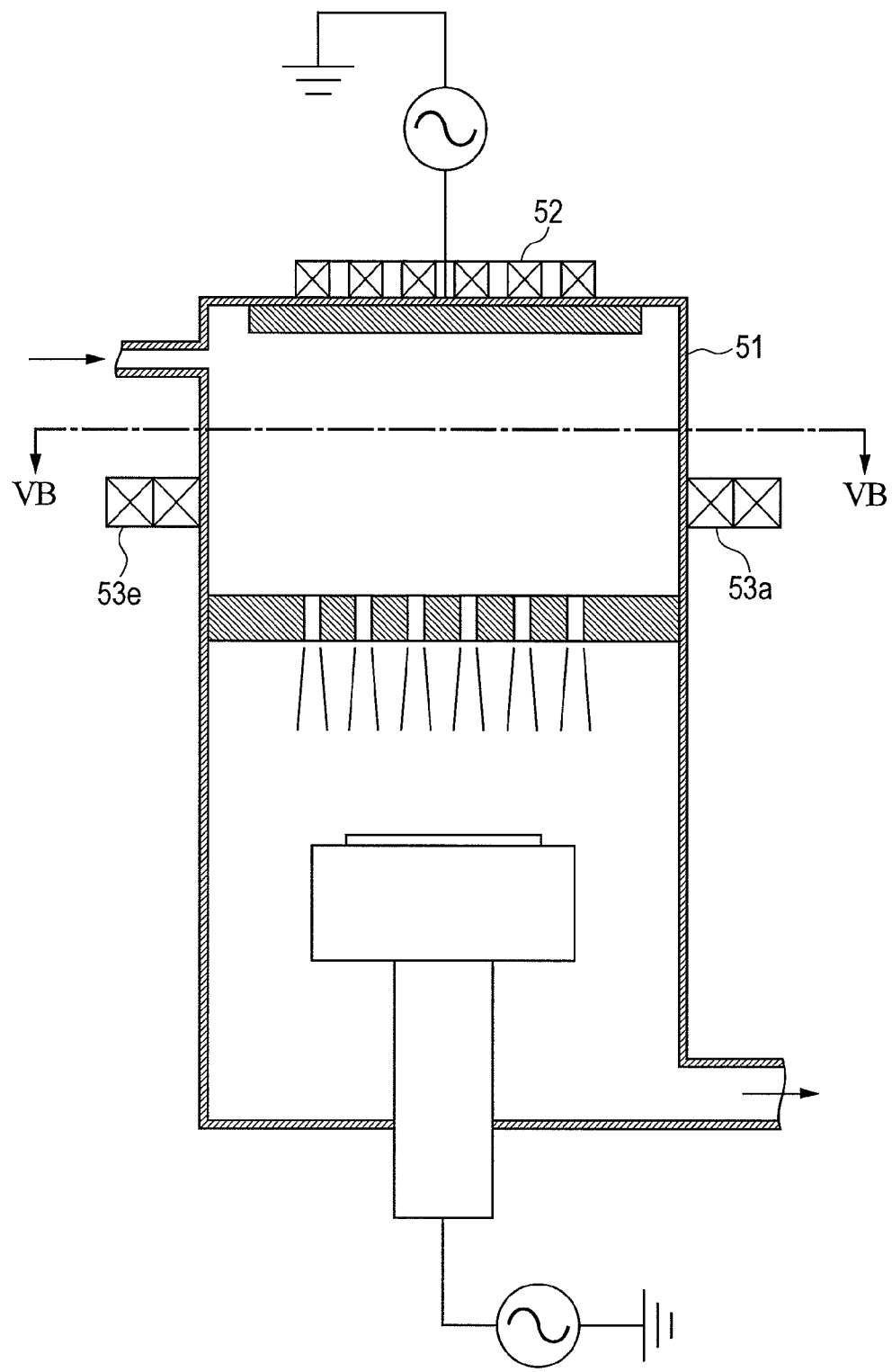
FIG. 5A is a schematic cross-sectional view showing the configuration of the conventional plasma processing device.
Figure 5B:
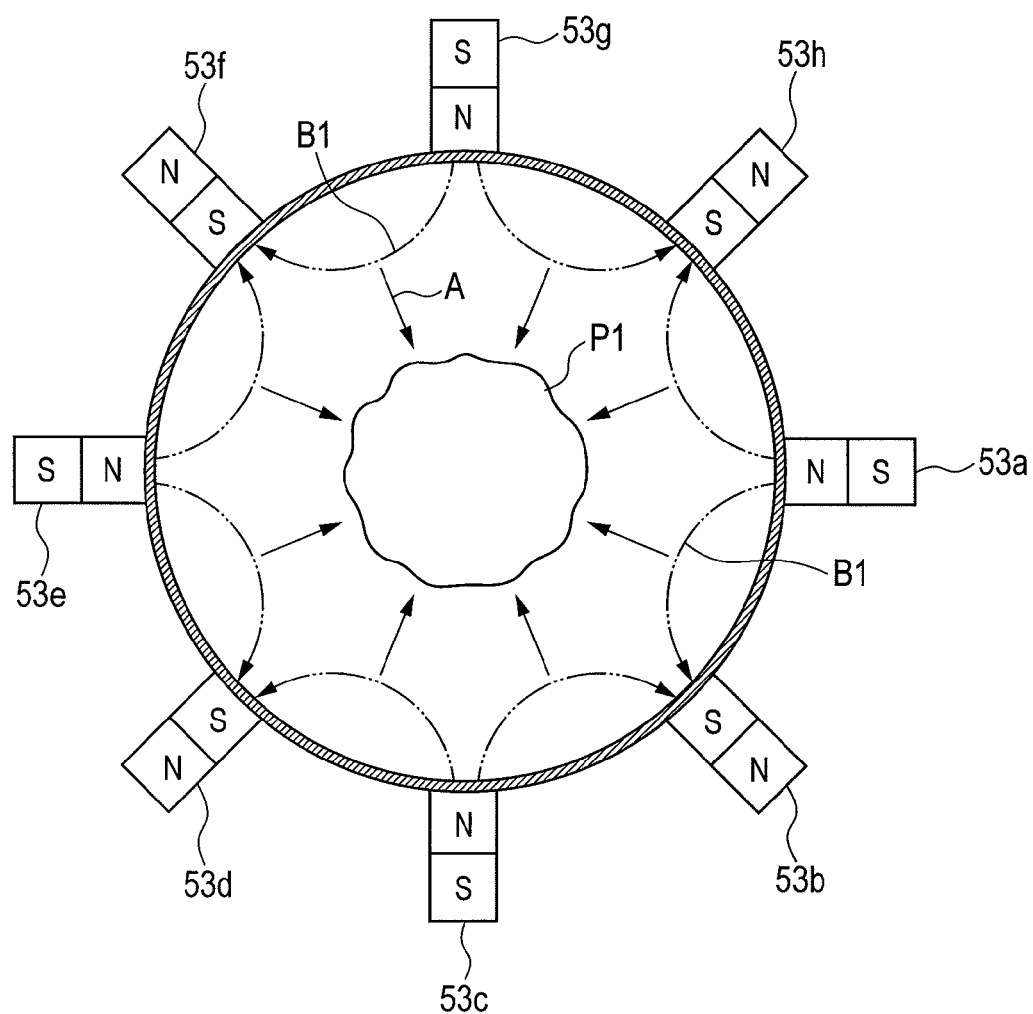
FIG. 5B is a cross-sectional view taken along line VB-VB of FIG. 5A.
Figure 6:
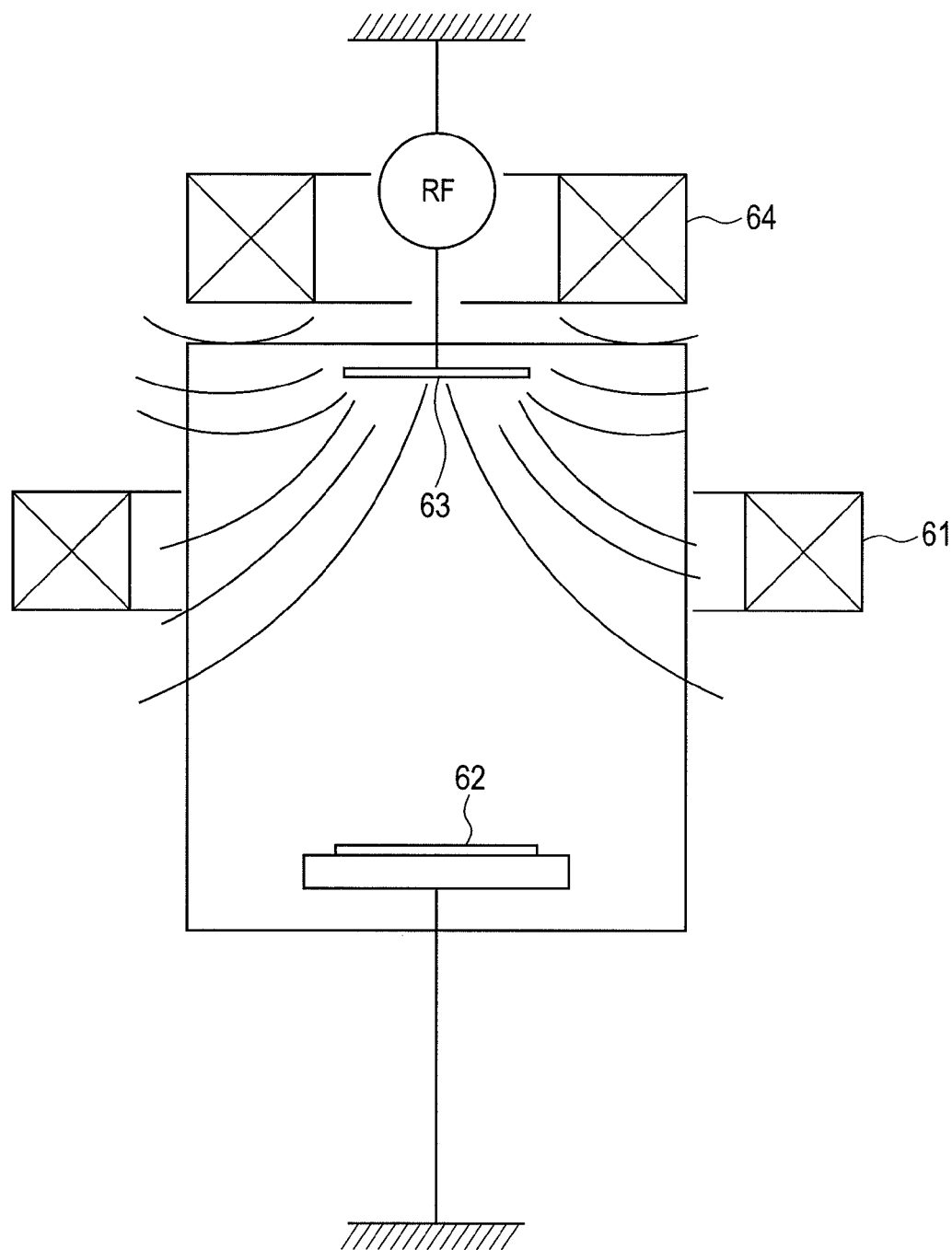
FIG. 6 is a schematic cross-sectional view showing the configuration of another conventional plasma processing device.

FIG. 4D shows the result of calculation of the distribution of magnetic field lines when the permanent magnets 13 of the magnetic circuit 3 are replaced with magnetic coils 41 in the present invention (the same arrangement as that of the magnetic circuit of patent document 2). In other words, FIG. 4D is a diagram showing the distribution of magnetic field lines when the permanent magnets 13 are replaced with the magnetic coils 41 which are arranged along the outer circumference of the side wall 27 such that the inner circumference of the magnetic coils contacts it. In FIG. 4D, the direction in which current is applied to the magnetic coils 41 coincides with the direction in which the current is applied to the magnetic coils 12. Hence, the direction of magnetization of the magnetic coils 41 coincides with that of magnetization of the magnetic coils 12. It is apparent from FIG. 4D that there is no collision area of the magnetic field lines generated by the two magnetic coils. FIG. 4E shows the result of calculation of the distribution of magnetic field lines when the current through the magnetic coils on the side of the side wall 27 of the vacuum vessel 1 of FIG. 4D is reversed (when the direction of magnetization of the magnetic coils 12 and that of magnetization of the magnetic coils 41 are reversed). As is apparent from FIG. 4E, the collision areas 16 of the magnetic field lines appear but it is impossible to adjust the position thereof in this structure, and it is difficult to effectively adjust the uniformity of the plasma.

According to the present invention, it is possible to generate a plasma having satisfactory uniformity in a wider area than in a conventional case. An example of an effective method of determining the structure of the magnetic circuit 3 is to calculate the magnetic field lines. It is possible to easily perform this calculation using, for example, the finite element method. The inventors of patent document 3 have already verified that the result of the calculation closely agrees with the distribution of density of the actual plasma; in order to experimentally check the result, it is effective to use a plasma density measurement method such as a Langmuir probe.

As described above, the structure of the magnetic circuit 3 is devised, and thus a range having satisfactory uniformity of the plasma is expanded, and thus it is possible to process a large-area substrate more easily than in a conventional method. Moreover, the current through the magnetic coils 12 is varied depending on usage conditions, and thereby it is possible to perform fine adjustment on the region having satisfactory uniformity of the plasma.

As is apparent from the above description, according to the present invention, one or a plurality of magnetic coils 12 is concentrically arranged on the side of the atmosphere of the plasma generation chamber 2 opposite the substrate to be processed 23, and the permanent magnets 13 are arranged in a ring shape on the side wall 27 of the plasma generation device. Current is caused to flow through the magnetic coils 12 in a direction so as to generate magnetic field lines downward from the center axis of the coils (the magnetic coils 12 are arranged such that the north poles of the magnetic coils 12 are positioned on the side of the vacuum vessel), and the permanent magnets 13 are arranged such that the north poles point to the direction of the center of the ring shape. In such a magnetic circuit structure, the current through the magnetic coils 12 is adjusted, and thereby it is possible to adjust the separatrices 8 to be formed into a desired shape, to adjust the range of the uniformity of plasma density and to realize uniform processing on the large-area substrate. The use of the magnetic coils 12 allows the adjustment range to be finely set, and it is possible to realize a plasma processing device that can easily and optimally adjust the range of the uniformity of plasma density.

That is, in the present embodiment, on the upper wall 26 of the vacuum vessel 1 that is the surface opposite the substrate holder 21 on which the substrate to be processed 23 is placed, the magnetic coils 12 in which the distribution of magnetic field lines can be adjusted by the applied current are arranged such that the north poles of the magnetic coils 12 point to the side of the vacuum vessel 1 (the inside of the vacuum vessel 1) and the south poles point to the side (the outside of the vacuum vessel 1) opposite the vacuum vessel 1, and the permanent magnets 13 are arranged on the side wall 27 of the vacuum vessel 1 such that the north poles point to the side of the vacuum vessel 1 (the inside of the vacuum vessel 1) and the south poles point to the side (the outside of the vacuum vessel 1) opposite the vacuum vessel 1. Therefore, the separatrices 8 that are generated by the magnetic field lines generated from the magnetic coils 12 and the magnetic field lines generated from the permanent magnets 13 can be formed so as to expand from the side of the magnetic coils 12 (the upper wall 26) toward the substrate holder 21.

Here, by controlling the current that is applied to the magnetic coils 12, it is possible to control the shape of the separatrices 8 without changing the magnets for forming the separatrices 8. Hence, although, in patent document 3, when the shape of separatrices 8 is changed, magnets for forming the separatrices 8 are needed to be changed as necessary, in the present embodiment, it is possible to easily adjust the shape of the separatrices 8 only by adjusting the value of a current applied to the magnetic coils 12 without changing the configuration of the magnetic circuit 3. In other words, in the present embodiment, the magnetic circuit 3 is configured such that the shape of the magnetic field lines formed by the magnetic circuit 3 is the shape shown in FIGS. 4A to 4C, and one of the components of the magnetic circuit 3 is arranged as the magnetic coils 12 on the side opposite the substrate holder 21. Therefore, the current that is applied to the magnetic coils 12 is controlled, and thereby it is possible to adjust the shape of the separatrices 8 that is formed so as to expand from the side of the upper wall 26 (the magnetic coils 12) of the vacuum vessel 1 to the side of the substrate holder 21.

Examples of the plasma processing device according to the present invention include a plasma etching device, a sputtering deposition device, a plasma CVD device and an ashing device.

In particular, in the plasma etching device, the plasma processing device is applicable to an ion beam etching device that performs microfabrication processing on an element such as MRAM containing a magnetic material such as a CoFeB/CoFe multilayer film.

Figure 7:
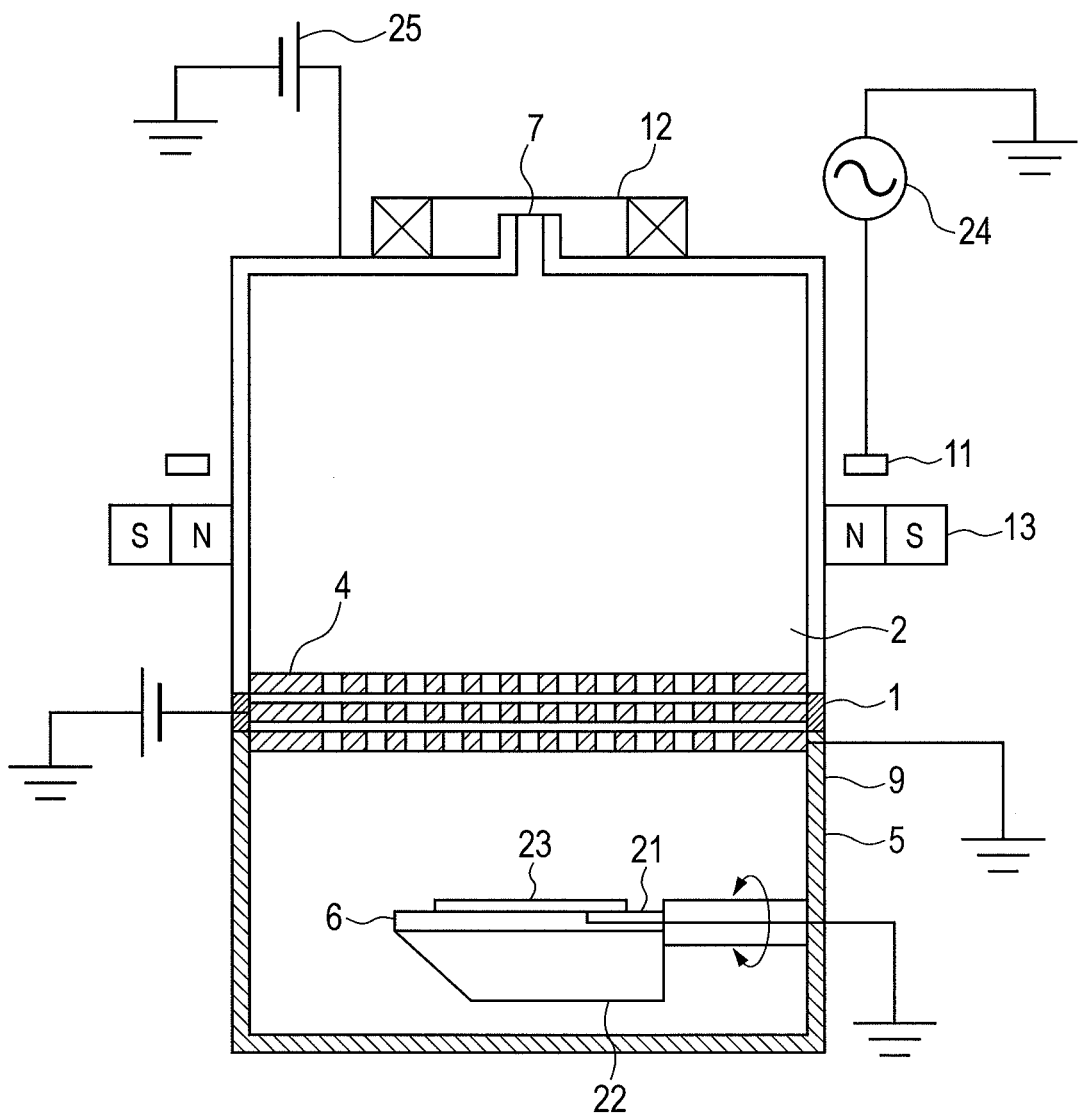
FIG. 7 is a schematic cross-sectional view showing the configuration of an ion beam etching device according to an embodiment of the present invention.

FIG. 7 shows an example of an ion beam etching device to which the present embodiment is applied. It is possible to obtain an ion beam having a widely uniform ion density by extracting the ion beam from the plasma generated widely and uniformly according to the present embodiment through an ion beam lens system formed with a plurality of grids 4. The extracted ion beam is incident on the substrate to be processed 23 arranged on the substrate holder 21, and thus it is possible to perform physical etching by the ion impact. Specifically, in FIG. 7, three grids (a first grid, a second grid and a third grid) are arranged vertically 2 to 3 mm apart from each other. Preferably, the diameter of the hole of the first grid is 4 mm; the diameter of the hole of the second grid is 5 mm; and the diameter of the hole of the third grid is 6 mm.

A mechanism for adjusting the angle at which the substrate is inclined is incorporated in the substrate holding mechanism 6, and thus it is possible to make the ion beam obliquely incident on the substrate to be processed 23, and this is effective in correcting the shape of the element.

In a semiconductor element such as an MRAM element in particular, when a chemical etching such as an RIE, which is conventionally used, is used, an unpredictable reactive layer is formed on the side surface of the element at the time of etching processing, and this may reduce the property of the element; however, the substrate inclination angle adjustment mechanism described above is utilized, and thus it is possible to remove the reactive layer.

A description will now be given of a case where the ion beam etching device of the present embodiment is used in a process of applying an ion beam.

As a multilayer magnetic film constituting a magnetoresistance effect element, for example, there is one which is one type of multilayer magnetic film (MR layer) and in which a lower electrode is formed on the substrate and a seven-layer multilayer film constituting the magnetoresistance effect element is formed thereon. In this case, as the seven-layer multilayer film, for example, there is one in which a Ta layer that is a base layer is formed on the lowest side, and, on the Ta layer, a PtMn layer that is an antiferromagnetic layer, a magnetization fixed layer (pinned layer, Ru, pinned layer), an insulation layer (barrier layer) and a free layer are stacked in this order, and a hard mask layer is stacked thereon.

The process of irradiating with an ion beam a multilayer magnetic film on which a reactive ion etching has been performed is a process of removing, with the ion beam irradiation, a damaged layer formed on the multilayer magnetic film when the reactive ion etching is performed. In this way, the layer damaged by oxidation when the reactive ion etching has been performed is removed, and thus it is possible to form a high quality multilayer magnetic film (MR layer).

In the process of applying the ion beam, the ion beam is preferably incident on a lamination plane of the multilayer magnetic film at an incident angle of 5 to 90 degrees. The reason is that the incident angle within the above range prevents or reduces the adherence of atoms and molecules of the damaged layer that has been removed by the ion beam etching mainly back to the side wall surface of the multilayer magnetic film after the removal.

Furthermore, the process of applying the ion beam is preferably performed under a condition that an accelerating voltage of the ion beam is set at 50 to 600 volts. The reason is that the above range reduces the impact of the ion beam on the multilayer magnetic film. In the view of the foregoing, the accelerating voltage of the ion beam is more preferably 50 to 200 volts.

The process of applying the ion beam is also preferably performed while the multilayer magnetic film is being rotated. The reason is that the applying of the ion beam while the multilayer magnetic film is being rotated prevents or reduces the adherence of atoms and molecules of the damaged layer that has been removed by the ion beam etching mainly back to the side wall surface of the multilayer magnetic film after the removal.

The present invention will now be described in more details with reference to accompanying drawings.

FIG. 8A is a flowchart showing an example of a method for manufacturing the magnetoresistance effect element according to the present embodiment; FIG. 8B is a diagram illustrating a cross-sectional structure of a pre-processing element 80 corresponding to the flowchart shown in FIG. 8A.

In FIG. 8B, a portion represented by reference numeral 81 is the multilayer magnetic film (MR layer). Examples of this multilayer magnetic film (MR layer) 81 includes: a TMR (tunnel magnetoresistance effect) multilayer body; a GMR (giant magnetoresistance effect) multilayer body of a CPP (current perpendicular to plane) structure; a TMR laminated body including a bias layer specifying a magnetization direction of the free layer or a GMR laminated body of the CPP structure; a GMR multilayer body of the CPP structure having an antiferromagnetic coupling multilayer film; a GMR multilayer body of the CPP structure having a specular type spin-valve magnetic multilayer film; and a GMR multilayer body of the CPP structure having a dual spin-valve type magnetic multilayer film.

Figure 11:
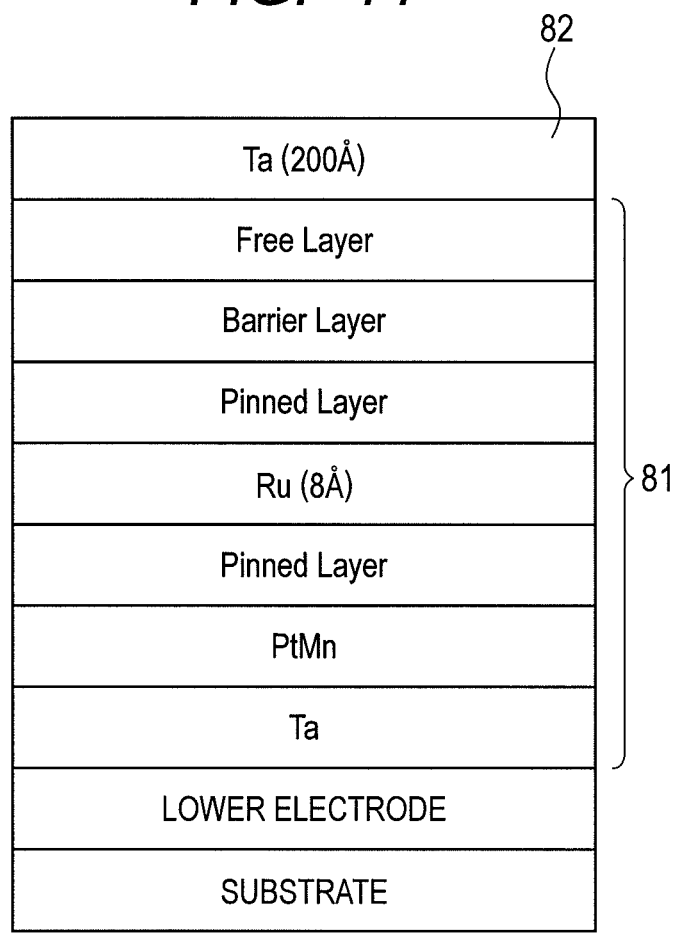
FIG. 11 is a diagram showing the configuration of a multiplayer magnetic film according to the embodiment of the present invention.

As the multilayer magnetic film (MR layer) 81, for example, as shown in FIG. 11, a multilayer magnetic film in which a lower electrode is formed on a substrate, and, on the lower electrode, a multilayer film constituting a magnetoresistance effect element is formed is used. In the example shown in FIG. 11, the multilayer film is formed with seven layers in which a Ta layer that is a base layer is formed on the lowest side, and, on the Ta layer, a PtMn layer that is an antiferromagnetic layer, a magnetization fixed layer (pinned layer, Ru, pinned layer), an insulation layer (barrier layer) and a free layer are stacked in this order, and a hard mask layer is stacked thereon.

A portion represented by reference numeral 82 in FIG. 8B is a hard mask layer; the hard mask layer can be a mask material formed with a single layer film or a laminated film of any of single elements that are Ta (tantalum), Ti (titanium), Al (aluminum) and Si (silicon), or a mask layer formed with a single layer film or a laminated film of an oxide or a nitride of any of Ta, Ti, Al and Si.

Figure 9:
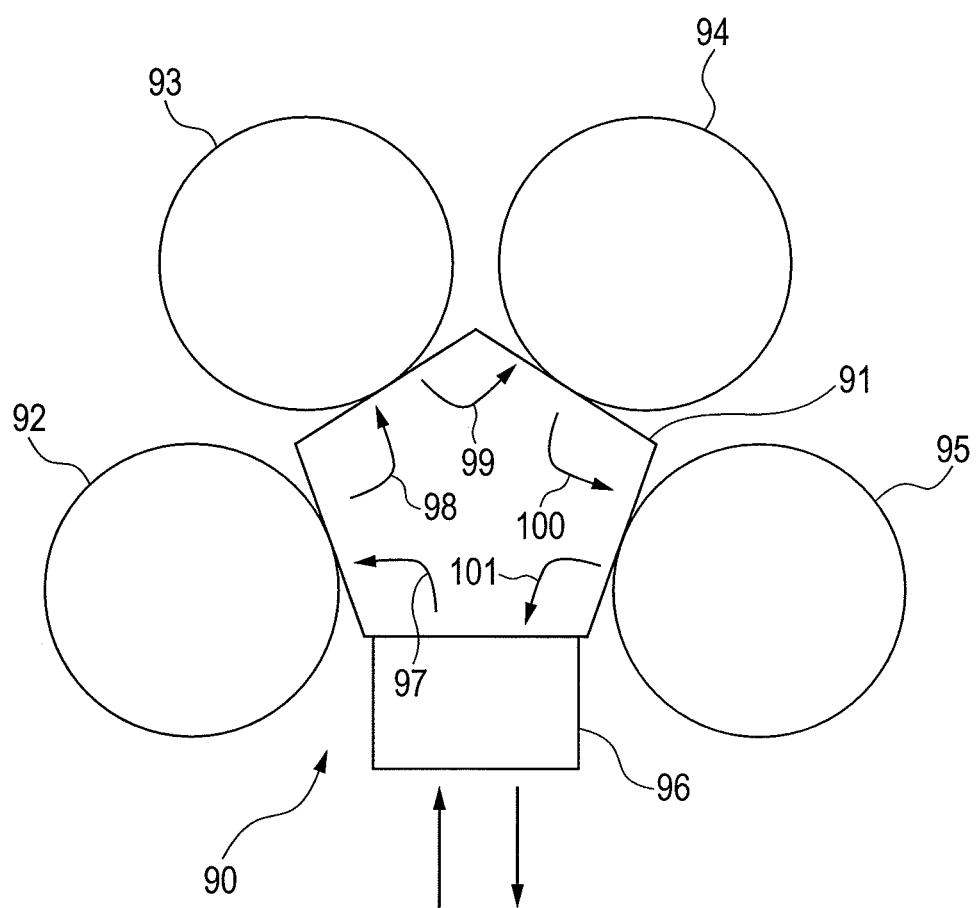
FIG. 9 is a diagram showing a device that produces the pre-processing element of the magnetoresistance effect element according to the embodiment of the present invention.

FIG. 9 is a configuration diagram illustrating an example of a manufacturing device 90 of the pre-processing element 80 of the magnetoresistance effect element according to the present embodiment.

In FIG. 9, reference numeral 91 represents a vacuum transport chamber; to this vacuum transport chamber 91, a first reactive ion etching chamber 92, a second reactive ion etching chamber 93, an ion beam etching chamber 94 and a film formation chamber 95 are connected so as to communicate with the vacuum transport chamber 91 through a blocking means (not shown) such as a gate valve.

The vacuum transport chamber 91 is further provided with a wafer loader 96; through this wafer loader 96, the pre-processing element 80 can be loaded into the vacuum transport chamber 91, and the element after the completion of the processing can be unloaded.

An unillustrated transport means is arranged within the vacuum transport chamber 91; the pre-processing element 80 loaded can be sequentially transported, as indicated by arrows 97, 98, 99, 100 and 101, to the first reactive ion etching chamber 92, then from the first reactive ion etching chamber 92 to the second reactive ion etching chamber 93, from the second reactive ion etching chamber 93 to the ion beam etching chamber 94 and then from the ion beam etching chamber 94 to the film formation chamber 95.

The transport of the pre-processing element 80 indicated by the arrows 97, 98, 99, 100 and 101 in FIG. 9 is consistently performed through the vacuum transport chamber 91 in a vacuum state without breaking the vacuum. The element transported from the film formation chamber 95 after the completion of the processing as indicated by an arrow 101 is unloaded from the vacuum transport chamber 91 to the outside through the wafer loader 96.

As described above, with the manufacturing device 90, the pre-processing element 80 is processed according to the flowchart shown in FIG. 8A.

The pre-processing element 80 loaded into the vacuum transport chamber 91 is first transported to the first reactive ion etching chamber 92, where the hard mask layer 82 is etched with a photoresist layer 83 formed on the upper surface of the pre-processing element 80 being used as a PR mask 84 (step 101).

Then, the pre-processing element 80 is transported from the first reactive ion etching chamber 92 to the second reactive ion etching chamber 93 with the vacuum state maintained. Then, by reactive ion etching using, as an etching gas, an alcohol having at least one hydroxyl group such as methanol, the multilayer magnetic film (MR layer) 81 is etched with the hard mask layer 82 used as a mask, that is, the multilayer magnetic film (MR layer) 81 is microfabricated (step 102).

As the etching gas, an alcohol having at least one hydroxyl group is used, and this produces the effect of increasing, as compared with a conventional case where a carbon monoxide gas to which ammonia gas is added is used, the speed of etching and reducing a damaged layer (a layer degraded mainly by oxidation). For example, as the etching gas, an alcohol having at least one hydroxyl group is used, and thus it is possible to reduce the thickness of the layer degraded by oxidation to about a few tens of angstroms.

By the processing performed in the second reactive ion etching chamber 93, the damaged layer 85 degraded mainly by oxidation is formed, as shown in the illustration of the third place from above in FIG. 8B, on the side wall and the upper surface of the multilayer magnetic film (MR layer) 81 or on the side wall of the multilayer magnetic film (MR layer) 81 and the side wall and the upper surface of the hard mask layer 82 whose part is left on the upper surface of the multilayer magnetic film (MR layer) 81.

The pre-processing element 80 after the completion of the processing performed in the second reactive ion etching chamber 93 is then transported to the ion beam etching chamber 94 of the present embodiment with the vacuum state maintained. Then, in the ion beam etching chamber 94, the damaged layer 85 is removed (step 103).

The ion beam etching chamber 94 is a processing chamber in which the damaged layer 85 is remove by ion beam etching using an inert gas such as Ar (argon), Kr (krypton), Xe (xenon) or the like.

As described above, even in the reactive ion etching processing that uses an alcohol having at least one hydroxyl group and that is little damaged, the damaged layer 85 may be formed. Hence, this thin damaged layer 85 is removed by the ion beam etching processing, and thus a higher quality magnetic thin film (MR layer) 81 can be obtained.

In the ion beam etching performed in the ion beam etching chamber 94, unlike plasma cleaning, by irradiating with a directional ion beam the laminated plane of the multilayer magnetic film at a predetermined incident angle, it is possible to prevent or reduce the re-adherence of part of atoms and molecules of the damaged layer 85 that has been separated by the impact of the ion beam back to the side of the multilayer magnetic film (MR layer) 81.

Hence, the incident angle (an angle represented by θ with respect to the laminated plane of the multilayer magnetic film 81) of the ion beam in the ion beam etching chamber 94 can be preferably changed to a desired angle.

The ion beam irradiation at an incident angle of 5 to 90 degrees produces the effect of preventing the re-adherence of part of atoms and molecules of the damaged layer 85 that has been separated by the impact of the ion beam back to the side of the multilayer magnetic film (MR layer) 81.

In the ion beam etching performed in the ion beam etching chamber 94, by irradiating with the ion beam the pre-processing element 80 while rotating it, it is possible to prevent or reduce the re-adherence of part of atoms and molecules of the damaged layer 85 that has been separated by the impact of the ion beam back to the side of the multilayer magnetic film (MR layer) 81. Hence, for example, a support stage (not shown) that is included in the ion beam etching chamber 94 and that supports the pre-processing element 80 is preferably a rotatable support stage while the ion beam is being applied.

The damaged layer 85 that is formed by the reactive ion etching processing which is performed in the second reactive ion etching chamber 93 and which uses, as an etching gas, an alcohol having at least one hydroxyl group has a thickness of about a few tens of angstroms at most. Hence, the ion beam etching processing performed in the ion beam etching chamber 94 can also be performed at such a low power as not to produce new damage such as crystal damage, and does not reduce a throughput that is the amount of production per unit time in the production efficiency.

Since the damaged layer 85 formed when the reactive ion etching is performed in the second reactive ion etching chamber 93 is thinner than a damaged layer formed when the reactive ion etching using carbon monoxide gas to which a conventional ammonia gas is added is performed, it is possible to remove the damaged layer by then applying the ion beam, within a time period during which the reactive ion etching governing the production efficiency of the manufacturing device is performed. Thus, according to the method of manufacturing the magnetoresistance effect element and the manufacturing device 80 of the present embodiment, the throughput that is the amount of production per unit time in the production efficiency is prevented from being reduced.

The pre-processing element 80 after the completion of the removal of the damaged layer 85 is then transported, with the vacuum state maintained, to the film formation chamber 95, where a protective film 86 is formed (step 104). The multilayer magnetic film (MR layer) 81 that has been cleaned after the removal of the damaged layer 85 is covered by the protective film 86, and thereby it is possible to keep the multilayer magnetic film (MR layer) 81 in a clean state.

One example of the protective film 86 is a film that is formed with, for example, aluminum oxide ($Al_2O_3$), aluminum nitride (AlN), a silicon oxide film ($SiO_2$), a silicon nitride film (SiN) and a hafnium oxide (HfOx) or a hafnium silicon oxide (SiHfOx). The method of forming the protective film 86 is not particularly limited; the protective film 86 can be formed by PVD (physical vapor deposition) such as sputtering or CVD (chemical vapor deposition).

Figure 10:
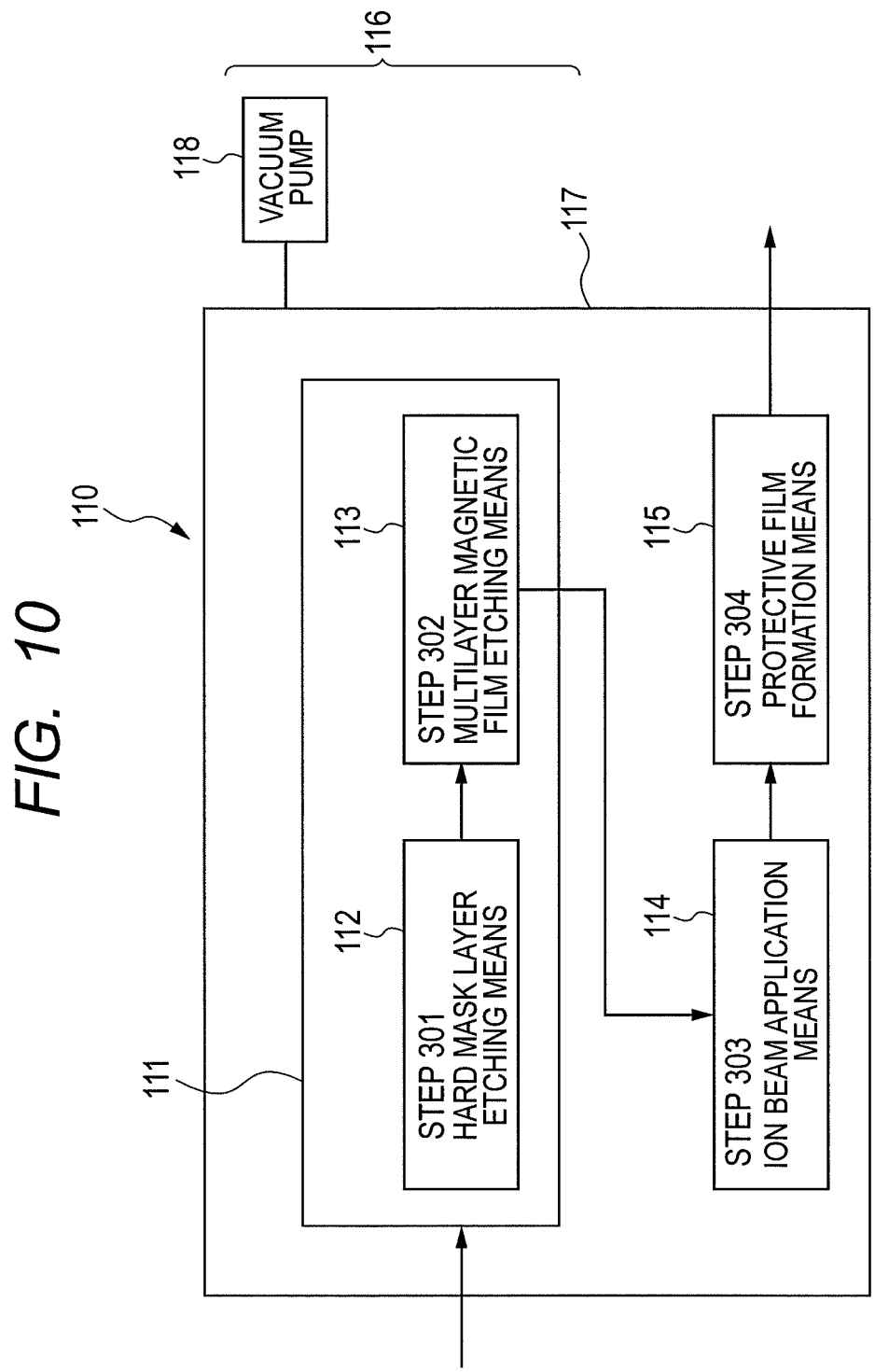
FIG. 10 is a schematic configuration diagram of the device that manufactures the magnetoresistance effect element according to the embodiment of the present invention.

The method of manufacturing the magnetoresistance effect element with the manufacturing device described above will be described with reference to FIG. 10; for example, the method will be performed as follows. The pre-processing element 80 that has been produced as described above is carried into the manufacturing device 110 of the magnetoresistance effect element shown in FIG. 10.

Etching processing is performed on the pre-processing element 80 that is transported into the manufacturing device 110 of the magnetoresistance effect element by reactive ion etching means 111 including a hard mask layer etching means 112 and a multilayer magnetic film etching means 113. For example, the hard mask layer is etched by the etching means 112 (the reactive ion etching device) that performs, with the reactive ion etching, the etching of the hard mask layer using the photoresist layer of the multilayer magnetic film as the PR mask (step S301).

Then, the multilayer magnetic film is etched by the etching means 112 (the reactive ion etching device) that performs, with the reactive ion etching, the etching of the multilayer magnetic film constituting the magnetoresistance effect element.

Then, the damage layer formed by the processing performed by the reactive ion etching means 111 is removed by ion beam application means 114 (ion beam etching device) (step 303). The plasma processing device according to the present embodiment is preferably applied to the ion beam application means 114.

Then, the multilayer magnetic film (MR layer) that has been cleaned after the removal of the damaged layer is covered with a protective film by protective film formation means 115 for forming a protective film (step 304), is kept in a clean state and is carried out.

These processes are performed by a vacuum chamber 117 and a vacuum pump 118 constituting vacuum maintaining means 116 in a state in which the vacuum is maintained.

Even in this kind of in-line type manufacturing device, since the method of manufacturing the magnetoresistance effect element according to the present invention is performed and thus the damaged layer of the multilayer magnetic film (MR layer) inevitably produced by the reactive ion etching is removed by the application of the ion beam, it is possible to manufacture a high quality magnetoresistance effect element. Moreover, since yields can be improved by enhancing the magnetic characteristic, it is possible to enhance the production efficiency.

Furthermore, the application of the ion beam to remove the damage layer produced in the manufacturing of the magnetoresistance effect element is performed in the plasma processing device according to the present embodiment, and thus it is possible to apply an ion beam with a uniform plasma density and remove the damaged layer with a high quality.

Second Embodiment

Although, in the first embodiment, the magnetic circuit 3 includes the magnetic coils 12 arranged on the upper wall 26 such that the north pole points to the inside of the vacuum vessel 1 and the south pole points to the outside of the vacuum vessel 1 and the permanent magnets 13 arranged on the side wall 27 such that the north pole points to the inside of the vacuum vessel 1 and the south pole points to the outside of the vacuum vessel 1, in the present embodiment, the configuration of the magnetic circuit 3 is not limited to this configuration.

In the present invention, as long as the magnetic circuit 3 in which the magnetic coils 12 are arranged on the side (the upper wall 26) of the vacuum vessel 1 opposite the substrate holder 21 is used and thus it is possible to form the separatrices 8 expanding from the opposite side toward the substrate holder 21, the magnetic circuit 3 may be freely configured.

For example, in the configuration shown in FIG. 1, the direction of the current applied to the magnetic coils 12 and the direction of magnetization of the permanent magnets 13 may be reversed such that these directions are opposite from those of the first embodiment. Specifically, the magnetic coils 12 may be configured such that magnetic field lines are formed to expand from the side of the side wall 27 toward the side of the upper wall 26 (the south pole of the magnetic coils points toward the inside of the vacuum vessel 1 and the north pole points to the outside of the vacuum vessel 1), and the permanent magnets 13 may be arranged such that magnetic field lines are formed to expand from the outside of the side wall 27 toward the inside of the upper wall 26 (the south pole points to the inside of the vacuum vessel 1 and the north pole points to the outside of the vacuum vessel 1).

The magnets arranged on the side wall 27 are not limited to permanent magnets; as long as a magnetic field can be generated, any component such as a magnetic coil or an electromagnet may be used. When, as described above, magnetic field generation means other than a permanent magnet such as a magnetic coil is used, the magnetic field generation means is arranged on the side wall 27 such that magnetic field lines are formed to expand from the position of the arrangement on the side wall 27 toward the outside or magnetic field lines are formed to expand from the outside of the position of the arrangement toward the position of the arrangement. In other words, the magnetic generation means is preferably provided such that one of the magnetic poles of the magnetic field generation means points to the inside of the vacuum vessel 1 and the other points to the outside of the vacuum vessel 1.

The direction of magnetization of the magnetic field generation means correlates with the direction of magnetization of the magnetic coils 12. In other words, it is necessary that the magnetic pole pointing to the inside of the vacuum vessel of the magnetic field generation means agree with the magnetic pole pointing toward the inside of the magnetic coils 12. When, as in the first embodiment, the magnetic pole of the magnetic coils 12 pointing to the inside of the vacuum vessel 1 is a north pole, the magnetic pole of the magnetic field generation means pointing to the inside of the vacuum vessel 1 is a north pole. On the other hand, when the magnetic pole of the magnetic coils 12 pointing to the inside of the vacuum vessel 1 is a south pole, the magnetic pole of the magnetic field generation means pointing to the inside of the vacuum vessel 1 is a south pole. With this configuration, it is possible to form the separatrices 8 that expand from the upper wall 26 toward the substrate holder 21.

For example, when the magnetic field generation means is magnetic coils, a plurality of magnetic coils is arranged along the outer circumference of the side wall 27 and the magnetic pole of the magnetic coils pointing to the inside of the vacuum vessel 1 agrees with the magnetic pole of the magnetic coils 12 pointing to the inside of the vacuum vessel 1. Hence, when the magnetic pole of the magnetic coils 12 pointing to the inside of the vacuum vessel 1 is a north pole, the magnetic coils provided on the side wall 27 are arranged on the side wall 27 such that the magnetic pole pointing to the inside of the vacuum vessel 1 is a north pole, and the magnetic pole pointing to the outside of the vacuum vessel 1 is a south pole.

Although, in the above embodiments, the magnetic coils 12 arranged on the upper wall 26 are described as the configuration of a function of adjusting the shape of the separatrices 8, the present invention is not limited to this configuration.

As is apparent from the above description, in the present invention, it is important that the shape of the separatrices 8 expanding from the upper wall 26 toward the substrate holder 21 can be adjusted without replacement of the magnetic field generation means such as a magnet. Hence, in the present invention, it is essentially important that the magnetic field generation means which can change the generated magnetic field (that is, the shape of the generated magnetic field lines) is provided. Therefore, in the present invention, as long as magnetic field generation means can adjust the generated magnetic field by a current applied thereto, the magnetic field generation means is not limited to the magnetic coils 12, and any such as an electromagnet may be used.

The invention claimed is:

1. A plasma processing device comprising:
a vacuum vessel;
a plasma generation mechanism for generating a plasma within the vacuum vessel;
a substrate holder that is arranged within the vacuum vessel and is for holding a substrate to be processed; and
a magnetic circuit for generating a magnetic field within the vacuum vessel,
wherein the magnetic circuit includes:
a first magnetic field generation means provided separately from the plasma generation mechanism and that includes a magnetic coil provided outside an upper wall of the vacuum vessel opposite the substrate holder and that is configured so as to generate, by the magnetic coil, a magnetic field line pointing from a center side of the upper wall toward a side wall side of the vacuum vessel or a magnetic field line pointing from the side wall side toward the upper wall side of the vacuum vessel; and
a second magnetic field generation means that is provided outside a side wall of the vacuum vessel along a circumferential direction of the side wall, that is arranged such that all of one of the magnetic poles points to an inside of the vacuum vessel and all of the other of the magnetic poles points to the outside of the vacuum vessel, and that is one and only one ring-shaped permanent magnet,
the plasma generation mechanism is provided between the magnetic coil provided outside the upper wall of the vacuum vessel and the second magnetic field generation means, and
according to a strength of a current applied to the magnetic coil, an area where a magnetic field line of the second magnetic field generation means collides with the magnetic field line of the first magnetic field generation means is changed either to the side wall side or to the center side to control a range of the plasma.

2. The plasma processing device of claim 1,
wherein the magnetic coil is provided so as to be parallel to and opposite the substrate holder,
the vacuum vessel is divided by a bulkhead plate having communication holes into a processing chamber for processing the substrate to be processed and a plasma generation chamber for generating the plasma with the plasma generation mechanism, and
the second magnetic field generation means is provided outside a side wall of the plasma generation chamber.

3. The plasma processing device of claim 1, wherein the one of the magnetic poles is a north pole and the other of the magnetic poles is a south pole.

4. The plasma processing device of claim 1, wherein a direction of a current flowing through the magnetic coil is applied such that a magnetic field line within the vacuum vessel points from a center of the vacuum vessel to the side wall.

5. The plasma processing device of claim 1, wherein a plurality of the magnetic coils is concentrically provided outside the upper wall of the vacuum vessel, and the magnetic coils are wound such that currents flow in the same direction.

6. The plasma processing device of claim 1, wherein the ring-shaped permanent magnet is formed by arranging segments of a magnet having a necessary magnetic field in a ring shape such that a direction of magnetization points to a center axis of the vacuum vessel.

7. The plasma processing device of claim 1, wherein the magnetic coil is provided such that a center axis of the magnetic coil is arranged to coincide with a center axis of the plasma generation chamber.

8. An ion beam etching device comprising the plasma processing device according to claim 1.

9. A plasma processing method comprising:
a step of arranging a substrate to be processed on a substrate holder provided within a vacuum vessel;
a step of generating a plasma within the vacuum vessel; and
a step of forming a separatrix expanding from an upper wall of the vacuum vessel opposite the substrate holder toward the substrate holder by a magnetic field line that is generated by a first magnetic field generation means including a magnetic coil provided outside the upper wall and that points, by the magnetic coil, from a center side of the upper wall toward a side wall side of the vacuum vessel or from the side wall side toward the upper wall side of the vacuum vessel and a magnetic field line that is generated by a second magnetic field generation means that is a permanent magnet provided outside the side wall of the vacuum vessel,
wherein, in the step of generating the plasma, the plasma is generated between the magnetic coil provided outside the upper wall of the vacuum vessel and the second magnetic field generation means, and in the step of forming the separatrix, a shape of the separatrix is adjusted by adjusting a current applied to the magnetic coil, and, according to a strength of the applied current, an area where the magnetic field line of the second magnetic field generation means collides with the magnetic field line of the first magnetic field generation means is changed either to the side wall side or to the center side to control a range of the plasma,
wherein the permanent magnet is provided along a circumferential direction of the side wall of the vacuum vessel such that the same magnetic pole points to an inside and an outside of the side wall of the vacuum vessel, and
wherein the permanent magnet is one and only one ring-shaped permanent magnet in which an inside of the circumferential direction of the side wall of the vacuum vessel is all of one of the magnetic poles and an outside of the circumferential direction of the side wall of the vacuum vessel is all of the other of the magnetic poles.

10. The plasma processing method of claim 9,
wherein the magnetic coil is provided so as to be parallel to and opposite the substrate holder,
the vacuum vessel is divided by a bulkhead plate having communication holes into a processing chamber for processing the substrate to be processed and a plasma generation chamber for generating the plasma with a plasma generation mechanism, and
the second magnetic field generation means is provided outside a side wall of the plasma generation chamber.

11. The plasma processing method of claim 9, wherein the magnetic coil is provided such that a center axis of the magnetic coil is arranged to coincide with a center axis of the plasma generation chamber.

12. A plasma processing device comprising:
a vacuum vessel divided by a bulkhead plate having communication holes into a processing chamber for processing a substrate to be processed and a plasma generation chamber for generating a plasma with a plasma generation mechanism;
a plasma generation mechanism for generating the plasma within the plasma generation chamber;
a substrate holder that is arranged within the processing chamber and is for holding the substrate to be processed; and
a magnetic circuit for generating a magnetic field within the vacuum vessel,
wherein the magnetic circuit includes:
a first magnetic field generation means that includes a magnetic coil provided outside an upper wall of the plasma generation chamber opposite the substrate holder so as to be parallel to and opposite the substrate holder and that is configured so as to generate, by the magnetic coil, a magnetic field line pointing from a center side of the upper wall toward a side wall side of the plasma generation chamber or a magnetic field line pointing from the side wall side toward the upper wall side of the plasma generation chamber; and
a second magnetic field generation means that is provided outside the side wall of the plasma generation chamber along a circumferential direction of the side wall, that is arranged such that all of one of the magnetic poles points to an inside of the plasma generation chamber and all of the other of the magnetic poles points to the outside of the plasma generation chamber and that is one and only one ring-shaped permanent magnet, and
according to a strength of a current applied to the magnetic coil, an area where a magnetic field line of the second magnetic field generation means collides with the magnetic field line of the first magnetic field generation means is changed either to the side wall side or to the center side to control a range of the plasma.

13. The plasma processing device of claim 12, wherein the magnetic coil is provided such that a center axis of the magnetic coil is arranged to coincide with a center axis of the plasma generation chamber.

14. An ion beam etching device comprising the plasma processing device according to claim 12.

15. A plasma processing method comprising:
a step of arranging a substrate to be processed on a substrate holder provided within a processing chamber of a vacuum vessel divided by a bulkhead plate having communication holes into the processing chamber for processing the substrate to be processed and a plasma generation chamber for generating the plasma with a plasma generation mechanism;
a step of generating a plasma within the plasma generation chamber by the plasma generation mechanism; and
a step of forming a separatrix expanding from an upper wall of the plasma generation chamber opposite the substrate holder toward the substrate holder by a magnetic field line that is generated from a first magnetic field generation means including a magnetic coil provided outside the upper wall of the plasma generation chamber so as to be parallel to and opposite the substrate holder and that points, by the magnetic coil, from a center side of the upper wall toward a side wall side of the plasma generation chamber or from the side wall side toward the upper wall side of the plasma generation chamber and a magnetic field line that is generated by a second magnetic field generation means that is a permanent magnet provided outside the side wall of the plasma generation chamber, wherein, in the step of forming the separatrix, a shape of the separatrix is adjusted by adjusting a current applied to the magnetic coil, and, according to a strength of the applied current, an area where the magnetic field line of the second magnetic field generation means collides with the magnetic field line of the first magnetic field generation means is changed either to the side wall side or to the center side to control a range of the plasma, the permanent magnet is provided along a circumferential direction of the side wall of the vacuum vessel such that the same magnetic pole points to an inside and an outside of the side wall of the vacuum vessel, and the permanent magnet is one and only one ring-shaped permanent magnet in which an inside of the circumferential direction of the side wall of the vacuum vessel is all of one of the magnetic poles and an outside of the circumferential direction of the side wall of the vacuum vessel is all of the other of the magnetic poles.

16. The plasma processing method of claim 15, wherein the magnetic coil is provided such that a center axis of the magnetic coil is arranged to coincide with a center axis of the plasma generation chamber.

\* \* \* \* \*